(12) United States Patent
Beierl et al.

(10) Patent No.: US 8,319,944 B2
(45) Date of Patent: *Nov. 27, 2012

(54) PROJECTION LENS SYSTEM OF A MICROLITHOGRAPHIC PROJECTION EXPOSURE INSTALLATION

(75) Inventors: Helmut Beierl, Heidenheim (DE); Sascha Bleidistel, Aalen (DE); Wolfgang Singer, Aalen (DE); Toralf Gruner, Aalen-Hofen (DE); Alexander Epple, Aalen (DE); Norbert Wabra, Werneck (DE); Susanne Beder, Aalen (DE); Jochen Weber, Heidenheim (DE); Heiko Feldmann, Schwaebisch Gmuend (DE); Baerbel Schwaer, Aalen (DE); Olaf Rogalsky, Oberkochen (DE); Ari Kazi, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 271 days.

This patent is subject to a terminal disclaimer.

(21) Appl. No.: 12/825,001

(22) Filed: Jun. 28, 2010

(65) Prior Publication Data

US 2010/0265478 A1 Oct. 21, 2010

Related U.S. Application Data

(63) Continuation of application No. 11/719,074, filed as application No. PCT/EP2005/012327 on Nov. 17, 2005, now Pat. No. 7,782,440.

(60) Provisional application No. 60/629,126, filed on Nov. 18, 2004.

(51) Int. Cl.
*G03B 27/42* (2006.01)
*G03B 27/52* (2006.01)

(52) U.S. Cl. .......................................... 355/53; 355/30
(58) Field of Classification Search .................. 355/30, 355/53, 67
See application file for complete search history.

(56) References Cited

U.S. PATENT DOCUMENTS

| | | | |
|---|---|---|---|
| 3,305,294 | A | 2/1967 | Alvarez |
| 4,825,247 | A | 4/1989 | Kemi et al. |
| 4,890,903 | A | 1/1990 | Treisman et al. |
| 4,965,630 | A | 10/1990 | Kato et al. |
| 6,104,472 | A | 8/2000 | Suzuki |
| 6,191,898 | B1 | 2/2001 | Trunz |
| RE38,320 | E | 11/2003 | Nishi et al. |
| 2002/0008861 | A1 | 1/2002 | Singer et al. |
| 2002/0054282 | A1 | 5/2002 | Sasaya et al. |

(Continued)

FOREIGN PATENT DOCUMENTS

EP 0 291 596 1/1994

(Continued)

OTHER PUBLICATIONS

Japanese Office Action for corresponding JP Application No. 2007-541792, dated Mar. 29, 2011.

(Continued)

*Primary Examiner* — Peter B Kim
(74) *Attorney, Agent, or Firm* — Fish & Richardson P.C.

(57) ABSTRACT

A microlithographic projection exposure apparatus comprises a projection objective which images an object onto an image plane and has a lens with a curved surface. In the projection objective there is a liquid or solid medium which directly adjoins the curved surface over a region which is usable for imaging the object. The projection exposure apparatus also has an adjustable manipulator for reducing an image field curvature which is caused by heating of the medium during the projection operation.

20 Claims, 17 Drawing Sheets

U.S. PATENT DOCUMENTS

| | | |
|---|---|---|
| 2004/0263812 A1 | 12/2004 | Hummel et al. |
| 2005/0179877 A1 | 8/2005 | Mulkens et al. |
| 2005/0264780 A1 | 12/2005 | Graeupner |
| 2005/0270505 A1 | 12/2005 | Smith |
| 2006/0012885 A1 | 1/2006 | Beder et al. |
| 2006/0066962 A1 | 3/2006 | Totzeck et al. |
| 2006/0221456 A1 | 10/2006 | Shafer et al. |
| 2007/0070316 A1 | 3/2007 | Ehrmann et al. |
| 2007/0165198 A1 | 7/2007 | Kneer et al. |

FOREIGN PATENT DOCUMENTS

| | | |
|---|---|---|
| EP | 0 660 169 | 12/1994 |
| EP | 1 128 218 | 8/2001 |
| EP | 1 231 515 | 8/2002 |
| JP | 9-050954 | 2/1997 |
| JP | 10-340846 | 12/1998 |
| JP | 2000-058436 | 2/2000 |
| JP | 2001-237165 | 8/2001 |
| JP | 2002-033276 | 1/2002 |
| JP | 2002-175964 | 6/2002 |
| JP | 2002-246309 | 8/2002 |
| WO | WO 2004/053596 | 6/2004 |
| WO | WO 2005/059617 | 6/2005 |
| WO | WO 2005/059654 | 6/2005 |

OTHER PUBLICATIONS

Conely, "New Fluids for 193nm Immersion Lithography," Immersion Workshop Jan. 28, 2004, Los Angeles, CA, URL: http://www.sematech.org/meetings/archives/litho/immersion/20040128/presentations/07%20New%20fluids-Conclusion_Conley.pdf.

Burnett et al., "High Index Materials for 193nm and 157nm Immersion Lithography," International Symposium on Immersion & 157nm Lithography, Aug. 3, 2004, Vancouver, URL: http://www.sematech.org/meetings/archives/litho/immersion/20040803/DAY_1_presentations/1-11_NIST_Burnett.pdf.

K.R. Wolf, "Phosphoric Acid as a High-Index Immersion Fluid," $22^{nd}$ Annual Microelectronic Engineering Conference, May 2004, pp. 40-43.

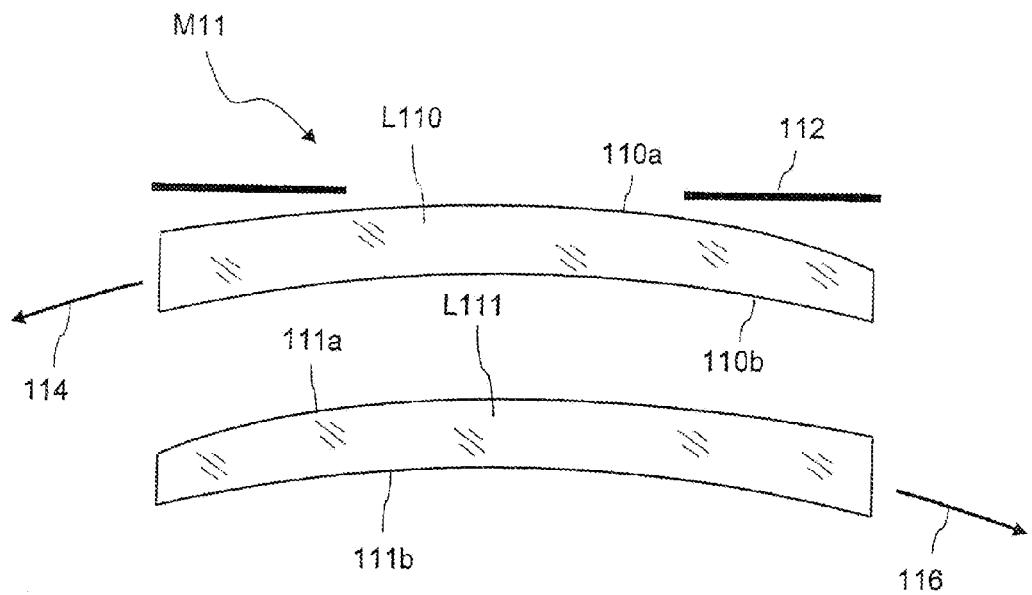
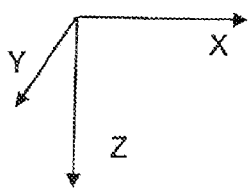
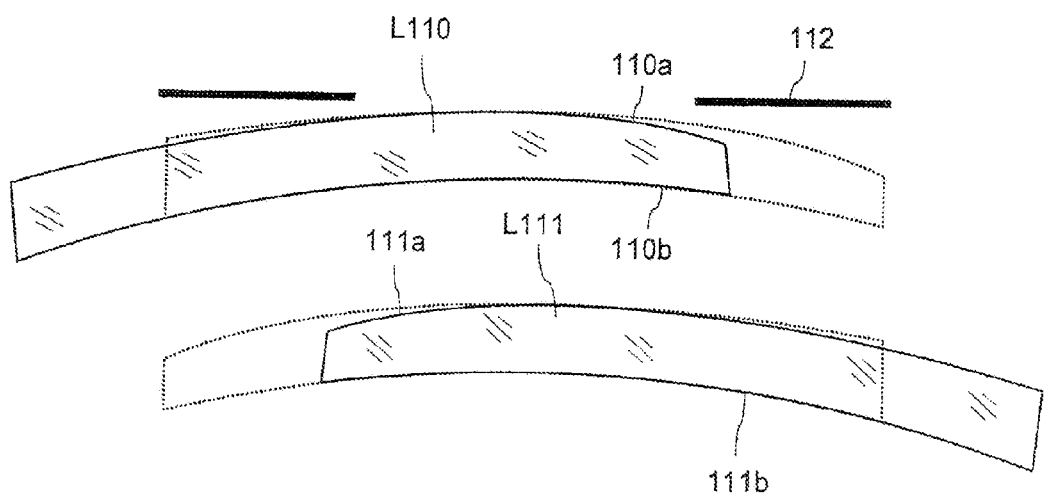
Fig. 11a
Fig. 11b

PROJECTION LENS SYSTEM OF A MICROLITHOGRAPHIC PROJECTION EXPOSURE INSTALLATION

CROSS-REFERENCE TO RELATED APPLICATIONS

This is a continuation of U.S. application Ser. No. 11/719,074, filed May 10, 2007, which is a national phase of international application PCT/EP2005/012327 filed Nov. 17, 2005, which claims priority under 35 U.S.C. §119(e)(1) to U.S. Provisional Application Ser. No. 60/629,126, filed Nov. 18, 2004. The entire contents of these applications are incorporated herein by reference.

BACKGROUND OF THE INVENTION

1. Field of the Invention

The present invention relates to projection objectives of microlithographic projection exposure apparatus, such as those used for the production of integrated circuits and other microstructured components.

2. Description of the Prior Art

For the production of large-scale integrated electrical circuits and other microstructured components, a plurality of structured layers is applied on a suitable substrate which, for example, may be a silicon wafer. In order to structure the layers, they are first covered with a photoresist which is sensitive to light of a particular wavelength range, for example light in the deep ultraviolet (DUV) spectral range. The wafer coated in this way is subsequently exposed in a projection exposure apparatus. A pattern of structures, which is located on a mask, is thus illuminated by an illumination system and imaged onto the photoresist by a projection objective. Since the imaging scale is generally less than 1, such projection objectives are often also referred to as reduction objectives.

After the photoresist has been developed, the wafer is subjected to an etching or deposition process so that the top layer becomes structured according to the pattern on the mask. The remaining photoresist is then removed from the other parts of the layer. This process is repeated until all the layers have been applied on the wafer.

The size of the structures which can be defined depends primarily on the resolution of the projection objective being used. Since the resolution of the projection objective increases as the wavelengths of the projection light become shorter, one way of increasing the resolution is to use projection light with shorter and shorter wavelengths. The shortest wavelengths used at present are in the deep ultraviolet (DUV) spectral range, namely 193 nm and 157 nm.

Another way of increasing the resolution is based on the idea of introducing an immersion medium with a high refractive index into the intermediate space which remains between a last lens on the image side of the projection objective and the photoresist, or another photosensitive layer to be exposed. Projection objectives which are specially designed for immersed operation, and which are therefore also referred to as immersion objectives, can achieve numerical apertures (NA) of more than 1, for example 1.3 or 1.4, on the image side. Moreover, immersion not only allows high numerical apertures and therefore an improved resolution, but also has a favorable effect on the depth of focus. The requirements for exact positioning of the wafer in the image plane of the projection objective are commensurately less stringent when the depth of focus is greater.

The immersion medium is generally a liquid. Solid immersion media have nevertheless been considered as well (solid immersion). The solid immersion medium does not then enter into direct contact with the photosensitive layer, but remains separated from it by a very narrow gap whose thickness is merely a fraction of the wavelength of the projection light being used. For the sake of simplicity, it will be assumed below that the immersion medium is an immersion liquid. Nevertheless, corresponding considerations also apply to solid immersion media.

The use of immersion liquids whose refractive index is more than the refractive index of the material of the last lens on the image side has now become established. In this way, it is possible to achieve a numerical aperture on the image side which is more than the refractive index of this lens material. If the lens material is quartz glass, for example, which has a refractive index $n_{SiO2}$ of approximately 1.56 at a wavelength of 193 nm, then it is possible to achieve numerical apertures of 1.6 or more on the image side. This is sometimes also referred to as high index immersion lithography (HIIL).

In HIIL immersion objectives, the surface on the image side of the last lens must be concavely curved. Only then is it possible to couple the projection light into the higher-index immersion medium without sizeable light losses occurring because of total reflection at the interface between the last lens on the image side and the immersion liquid. The effect of the concave curvature of the last surface on the image side is that the immersion liquid forms a liquid lens with a positive refracting power between the wafer and the projection objective.

Examples of the structure of immersion objectives with such a concavely curved last surface on the image side can be found in WO 2005/081067, WO 2005/059617 and WO 2005/059654.

When using such HIIL immersion objectives, however, it has been found that it is difficult to ensure a consistently high imaging quality during the projection operation. Similar problems moreover occur in projection objectives with liquid lenses which lie inside a projection objective.

SUMMARY OF THE INVENTION

It is an object of the invention to provide measures by which a high imaging quality can be ensured in HIIL immersion objectives, or in projection objectives in which liquid lenses are arranged. In particular, these measures are intended to make sure that variations of the imaging quality during the projection operation remain within tolerable limits.

This object is achieved by a microlithographic projection exposure apparatus having
  a) a projection objective, which images an object onto an image plane and has a lens with a curved surface,
  b) a liquid or solid medium which directly adjoins the curved surface over a region which is usable for imaging the object, and having
  c) an adjustable manipulator for reducing an image field curvature which is caused by heating of the medium during the projection operation.

The inventors have discovered that the variations of the imaging quality are temperature variations of the medium during the projection operation. The medium may be a liquid, but also a solid body in the case of solid immersion. The medium is generally heated more than the other refractive elements of the projection objective when the projection light passes through. This is related to the fact that the suitable media generally have a higher absorptivity for the projection light. The relatively strong heating by the projection light leads to a change in the refractive index of the medium, which is comparatively large. For example, water has a refractive index temperature dependency of about $-1.0*10^{-4}$ $K^{-1}$ at a wavelength $\lambda=193$ nm; for liquid media with a refractive index of more than 1.5, the temperature dependency should be of the same order of magnitude. Compared with this, at the same wavelength, the temperature dependency of the refractive index of quartz glass is merely $+1.94*10^{-5}$ $K^{-1}$, and that of calcium fluoride ($CaF_2$) even only $-2.9*10^{-6}$ $K^{-1}$.

For most media, the temperature dependency is negative. This means that when the temperature of the medium rises, its refractive index decreases. If the lens formed by the medium has for example a positive refracting power, as is the case for HIIL in immersion liquids, then this decreases correspondingly.

The temperature to be adjusted in the medium depends not only on the duration and the process parameters of the projection operation, but also on the mask to be projected, and for this reason cannot be readily predicted. It is therefore not possible to factor the temperature-induced refracting power change into the design of the projection objective.

The temperature-induced refracting power change of the medium affects the Petzval sum of the projection objective, since the surface refracting powers of the reflectively acting optical elements of the immersion objective contribute to the Petzval sum. The value of the Petzval sum is a measure of the image field curvature. The term image field curvature is intended to mean an imaging error in which an object plane orthogonal to the optical axis is imaged onto a curved surface whose vertex curvature is referred to as the Petzval curvature. The latter is given by the product of the Petzval sum and the image-side refractive index of the material of the last surface.

WO 2005/071491 A2 discloses measures by which the temperature distribution in an immersion liquid can be adjusted in a controlled way. The goal is generally a homogeneous or at least rotationally symmetric temperature distribution. This counteracts the forming of striations. Whether the temperature distribution of the immersion liquid can thereby be kept so constant throughout the operating time that image field curvatures do not occur, however, remains unresolved.

It is furthermore known in the prior art to detune the wavelength of the projection light in projection objectives with a lower numerical aperture, in order to correct minor image field curvatures. Owing to the dispersion of the lens materials, this changes the refractive index ratios at the interfaces and therefore the Petzval sum. Furthermore, additional Z manipulators have to be operated in order to correct image errors which have been induced by detuning the wavelength.

However, the wavelength of the lasers conventionally used as light sources can be detuned only to a very limited extent. Furthermore, sizeable wavelength changes would also intolerably reduce the transmissivity of the optical elements of the projection objective. Merely by changing the wavelength, therefore, it is not possible to compensate for sizeable variations of the Petzval sum such as those typically caused by temperature changes in the medium.

It is known from EP 0 851 304 B1 to displace two aspherical non-rotationally symmetric optical elements along a direction perpendicular to the optical axis, in order to correct image field curvatures in projection objectives.

In immersion objectives with numerical apertures which are less than the refractive index of the material of the last lens, moreover, a temperature-induced change of the image field curvature does not occur. This is because the surface on the image side of the last lens is plane there, and the immersion medium thus forms a plane-parallel plate with no refracting power. A change in the refractive index of the plate because of heating generates merely spherical aberrations in a beam path which is telecentric on the object side, and these can be corrected well by conventional Z manipulators.

As already mentioned, a temperature change of a medium with a positive refracting power generally causes a reduction of the Petzval sum. If only a reduction of the Petzval sum can likewise be achieved with the aid of the manipulator, then it is advantageous to deploy the manipulator in the basic state of the projection objective and reduce the deployment for the manipulator when the medium is heated.

Control of the manipulator can generally be carried out by repeated measurement of the image field curvature using sensors which are known per se, or by matching the operating state with tabulated information. To this end, for example, the heating of the medium during operation of the projection exposure apparatus is determined. In particular, a direct measurement of the temperature of the medium or an extrapolation based on parameters such as the illumination angle distribution and operating time may be suitable for this. From the heating which is found, the image field curvature is determined by comparison with information held in tables.

The required correction can be determined beforehand by measurements and may depend on parameters such as illumination angle distributions, mask transmission, diaphragm aperture, scanning speed and other operating parameters.

In order to correct temperature-induced image field curvatures, however, it is also possible to use a control loop in which the temperature and/or the refractive index of the medium in the projection objective is measured. The manipulator is adjusted as a function of the measured values. It is naturally most favorable for the measurement to be carried out in the beam path, and furthermore at a plurality of positions owing to the formation of temperature and/or refractive index gradients. Measuring these quantities over sizeable volumes, however, requires relatively great outlay. When determining the refractive index distribution, therefore, it is also possible to employ simulations or empirical values held in tables. As an alternative to this, it is possible to deduce the temperature and refractive index distribution of the medium from quantities which are easy to measure, for example outside the projection objective.

BRIEF DESCRIPTION OF THE DRAWINGS

Other features and advantages of the invention will be found in the following description of an exemplary embodiment with reference to the drawings, in which:

FIG. 11a shows a meridian section through a manipulator for the correction of temperature-induced image field curvatures according to an eighth exemplary embodiment of the invention, in which two aspherical lenses can be swiveled synchronously with each other;

FIG. 11b shows the manipulator of FIG. 11a after swiveling of the two aspherical lenses;

DESCRIPTION OF PREFERRED EXEMPLARY EMBODIMENTS

Figure 1:
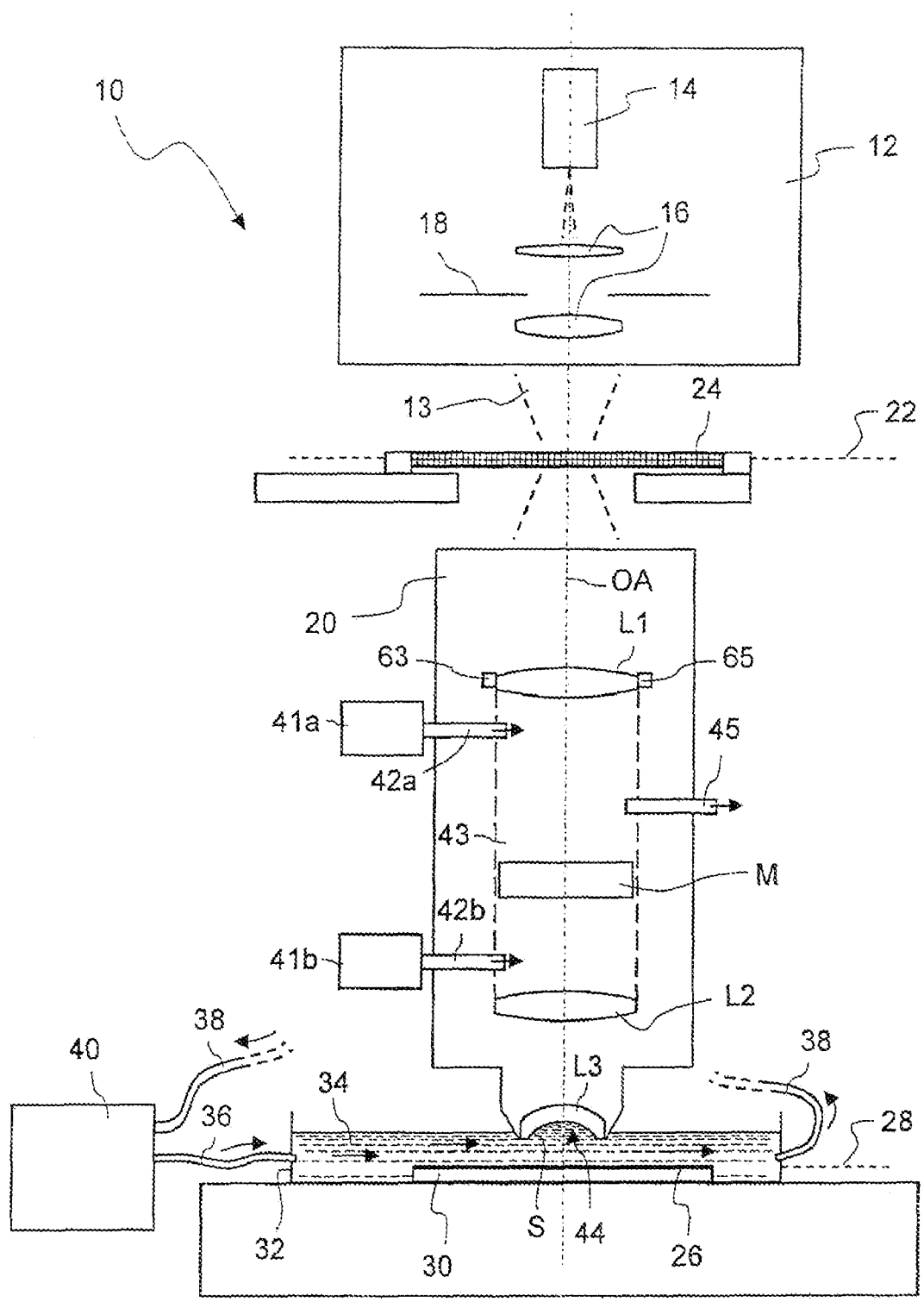
FIG. 1 shows a schematic representation of a projection exposure apparatus with an illumination system and a projection objective, in a meridian section.

FIG. 1 shows a meridian section through a microlithographic projection exposure apparatus, denoted overall by 10, in a highly simplified schematic representation. The projection exposure apparatus 10 has an illumination device 12 for generating projection light 13, which contains inter alia a light source 14, illumination optics indicated by 16 and a field diaphragm 18. In the exemplary embodiment which is represented, the projection light has a wavelength of 193 nm. It is of course also possible to use other wavelengths, for example 157 nm or 248 nm.

The projection exposure apparatus 10 furthermore includes a projection objective 20 which contains a multiplicity of optical elements such as lenses, mirrors or filter elements. Three lenses L1, L2 and L3 are represented as examples of these in FIG. 1. The projection objective 20 is used to image a mask 24, which is arranged in an object plane 22 of the projection objective 20, onto a photosensitive layer 26 which, for example, may consist of a photoresist. The layer 26 is arranged in an image plane 28 of the projection objective 20 and is applied on a support 30.

The support 30 is fastened on the bottom of a trough-like, open-topped container 32 which can be displaced (in a way which is not represented in detail) parallel to the image plane 28 with the aid of a displacement device. The container 32 is filled with an immersion liquid 34 so that the projection objective 20 is immersed with its last lens L3 on the image side into the immersion liquid 34 during operation of the projection exposure apparatus 10. In the exemplary embodiment which is represented, the last lens L3 on the image side consists of calcium fluoride ($CaF_2$) which has a refractive index $n_{CaF2}=1.5014$ at a wavelength of 193 nm.

The immersion liquid is a particularly high-index immersion liquid with a refractive index $n_L$ of more than 1.5. An example of such an immersion liquid is a mixture of 85 wt. % phosphoric acid ($H_3PO_4$) and 15 wt. % water. At a wavelength of 193 nm, this mixture has a refractive index $n_L=1.54$. Further details of this can be found in an article by K. R. Wolf entitled *"Phosphoric Acid as a High-Index Immersion Fluid"*, 22nd Annual Microelectronic Engineering Conference, May 2004, pages 40 to 43. Immersion liquids with refractive indices of more than 1.6 are described in WO 2005/074606. The immersion liquid 34 therefore has a higher refractive index than the last lens L3 on the image side.

Via a feed line 36 and a discharge line 38, the container 32 is connected to a treatment unit 40 which (in a manner which is known per se and therefore not represented in detail) contains a circulating pump, a filter for cleaning the immersion liquid 34 and a temperature regulator.

The container 32 may also be omitted if the feed line 36 and the discharge lines 38 extended directly to the last lens L3 on the image side, as is known per se in the prior art.

In the exemplary embodiment which is represented, the lens L3 is a thick meniscus lens which has a concavely curved surface S toward the image plane 28. A cavity, which is not represented true to scale in FIG. 1, is thereby formed between the surface S and the photosensitive layer 26.

Owing to the concave curvature of the last surface S, only relatively small ray incidence angles occur there. The reflection losses at the surface S are therefore correspondingly small. Even rays with large aperture angles with respect to an optical axis OA of the projection objective 20 can therefore contribute to the imaging, so that numerical apertures which extend up to the refractive index $n_L$ of the immersion liquid 34 can be achieved with the projection objective 20.

The immersion liquid 34 in the cavity forms a liquid lens 44 with a positive reflecting power since, on the one hand, the refractive index of the immersion liquid 34 is higher than the refractive index of the lens L3 next to it on the object side and, on the other hand, the interface between the lens L3 and the immersion liquid 34 is concavely curved. Heating of the liquid lens 44 occurs during the projection operation. Owing to the comparatively high absorptivity of the immersion liquid 34, the liquid lens 44 is heated more strongly than the last lens L3 on the image side. Furthermore, the temperature dependency of the refractive index in the liquid lens 44 (about $-1.0*10^{-4} K^{-1}$ at a wavelength $\lambda=193$ nm) is greater than that of calcium fluoride ($-2.9*10^{-6} K^{-1}$).

The heating leads to a reduction of the refractive index of the immersion liquid 34. The refracting power of the liquid lens 44 is therefore also reduced. This reduction of the refracting power of the liquid lens 44 affects the Petzval sum of the immersion objective 20, since the refracting powers of all refractively acting optical elements of the immersion objective 20 contribute to the Petzval sum.

In order to counteract a change of the Petzval sum, which is caused by a temperature rise of the liquid lens 44, the liquid lens 44 may itself be influenced so that its refracting power does not vary despite the temperature change. As an alternative to this, it is possible to compensate for a variation of the refracting power of the liquid lens 44 by changing the refracting power of one or more other refractive optical elements with opposite signs. The two aforementioned possibilities may also be combined. This means that the refracting power change of the liquid lens 44 is counteracted not fully but only partially. The remaining refracting power change is then compensated for by an opposite refracting power change of one or more other optical elements.

When the term "liquid lens" is used below, this is firstly intended to mean the liquid lens 44 formed by the immersion liquid 34. It is nevertheless to be understood that the same measures may also be applied to a solid immersion medium or a liquid lens inside the projection objective. This liquid lens inside the projection objective may also be intended to correct image field curvatures which result from heating of the immersion liquid, or another liquid lens inside the projection objective.

In order to change the refracting power of the liquid lens or another optical element in a controlled way, there are in principle two viable measures which may be combined together if need be. On the one hand, it is possible to influence the refractive index via a change of the refractive index ratio at refractively acting interfaces. On the other hand, the shape of refractively or reflectively acting interfaces may be varied.

Various exemplary embodiments of manipulators, the actions of which are based on the two said principles, will be explained in detail below. The manipulators may furthermore be combined into different subgroups. Each manipulator may be used on its own or in combination with other manipulators for complete or partial correction of the image field curvature. In principle, moreover, each manipulator may also be used for the correction of image field curvatures in projection objectives, which are not temperature-induced.

1. Variation of the Refractive Index 1.1 Introducing Salts into a Liquid

The refractive index of liquids can be varied by introducing salts. If the temperature of the liquid lens 44 rises, for example, and its refractive index therefore decreases, then salts which increase the refractive index will be added to the immersion liquid so that the refractive index returns to its original value. Very generally, the addition of salts will thus be controlled so that the refractive index of a liquid remains unaltered despite a temperature change.

In the projection exposure apparatus shown in FIG. 1, the salts are added to the immersion liquid 34 in the treatment unit 40.

It is possible to add salts not only in the immersion liquid 34 but also in other liquid lenses inside the immersion objective, in order to vary the refracting power so as to correct temperature-induced image field curvatures.

1.2 Immiscible Immersion Liquids

Figure 2:
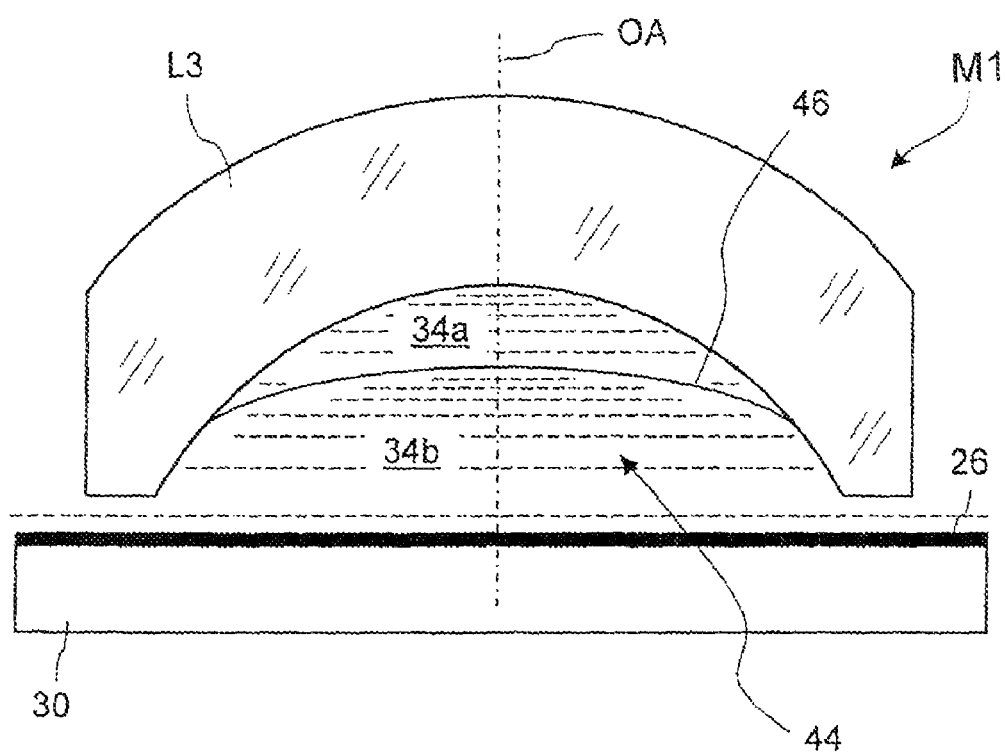
FIG. 2 shows a meridian section through a manipulator for the correction of temperature-induced image field curvatures according to a first exemplary embodiment of the invention, in which two immiscible immersion liquids with different refractive indices are introduced into an immersion space.

In the manipulator shown in FIG. 2, which is denoted by M1, two or more immersion liquids 34a, 34b which have different refractive indices and are not miscible with one another are used for the liquid lens 44. The average refractive index of the liquid lens 44, and therefore also its refracting power, are thereby varied so that a temperature-induced image field curvature can be corrected.

The immiscible immersion liquids 34a, 34b form an interface 46 between them, which in general will be gently curved as shown exaggeratedly in FIG. 2. A refracting surface therefore simultaneously has its shape changed by this measure, which will be explained in more detail below in 2.1. The refracting power of the overall liquid lens 44 is thus determined by the refractive indices of the two immersion liquids 34a, 34b, their quantities and the shape of the interface 46.

This approach is not only possible for the immersion liquid, but may also be used for other liquid lenses inside the immersion objective, in order to vary the refracting power so as to correct temperature-induced image field curvatures.

1.3 Homogeneous Mixing of at Least Two Liquids to Form an Immersion Liquid

A homogeneous mixture of at least two liquids with different refractive indices is used as the immersion liquid 34. The refractive index of the immersion liquid is changed by varying the mixing ratio of the two liquids, so as to compensate for the temperature-induced change of the refractive index. The optical properties of the liquid lens 44 can thus be kept constant over the exposure time, if the composition of the mixture is adapted to the changing situation during operation.

In the projection exposure apparatus shown in FIG. 1, the at least two liquids may be mixed together in the treatment unit 40.

The mixing of two liquids is not only possible for the immersion liquid, but may also be used for other liquid lenses inside the immersion objective, in order to vary the refracting power so as to correct temperature-induced image field curvatures.

The curved surface S of the last lens L3 entails the risk that perturbing turbulence may occur during operation. This can be avoided by controlled variation of the viscosity of the immersion liquid 34. The variation may, for example, be carried out in that a liquid with a particular refractive index in turn comprises two components of equal refractive index but different viscosities. The viscosity of the liquid can be changed by varying the mixing ratio of the two components.

1.4 Mixing of a Gas

If there is a gas next to at least one curved lens surface in the projection objective 10, then the refractive index of this gas may be varied so as to cause a refracting power change. Such a manipulator can thus be used to correct image field curvatures.

The refracting power change can be effected by complete or partial replacement of a first gas by a second gas, the gases differing by their refractive index. Partial replacement corresponds to changing the mixing ratio between the first gas and the second gas. More than two gases may of course be mixed or fully replaced by one another. The gases may, for example, be nitrogen, helium or oxygen.

As an alternative or in addition, the refractive index in the intermediate space may also be influenced by changing the gas pressure.

Two pressurized gas containers 41a and 41b for two gases with different refractive indices are schematically arranged in FIG. 1. The gases can be introduced via valve-controlled feeds 42a and 42b into a gas-tight intermediate space 43 between the lenses L1 and L2. The mixing ratios of the two gases can be adjusted using the valves. The pressure inside the intermediate space 43 may, for example, be adjusted using a valve in a gas outlet 45.

1.5 Temperature Variation of Liquids

In principle, it is also possible to produce a refracting power change by altering the temperature of optical elements (in particular lenses and mirrors) or of gases lying between optical elements. To this end, for example, heating or cooling elements may be arranged in the vicinity and in particular at the circumference of an optically used region of an optical element. These may, for example, direct a laminar gas stream onto the optical element as is known per se in the prior art.

As an alternative or in addition, lenses may be deliberately exposed using a second radiation source for light with a wavelength which differs from the wavelength of the projection light, in order to vary the refractive index locally at the exposed positions. The change in the refractive index is arranged so that the refracting power change due to it reduces temperature-induced image field curvatures.

With heating of lenses and other optical elements, however, fast corrections of an image field curvature are not possible since the desired temperature distribution is set up comparatively slowly.

It is therefore generally more effective for an intermediate space between two optical elements, for example between two lenses, to be filled with a liquid. In terms of composition, the liquid may be the same liquid as an optionally provided immersion liquid. At least one surface next to the liquid is then curved so that the liquid forms a liquid lens. By controlled heating or cooling of the liquid in the intermediate space, it is possible to change the refracting power of the liquid lens.

Since liquids themselves heat up when projection light passes through them during operation, self-regulating correction of temperature-induced image field curvatures is also thereby possible. Very generally, a temperature rise in the manipulator must then cause a change of the Petzval sum which has the opposite sign to a change of the Petzval sum which is induced in the medium to be corrected.

For the self-correction of an image field curvature induced by the immersion liquid 34, this means that the corrective liquid lens has a negative refracting power. With a suitable design, the change of the negative refracting power of the corrective liquid lens then compensates for the change of the positive refracting power of the liquid lens 44 formed by the immersion liquid 34. This will be explained in more detail below with reference to an exemplary embodiment shown in FIGS. 3 and 4.

Figure 3:
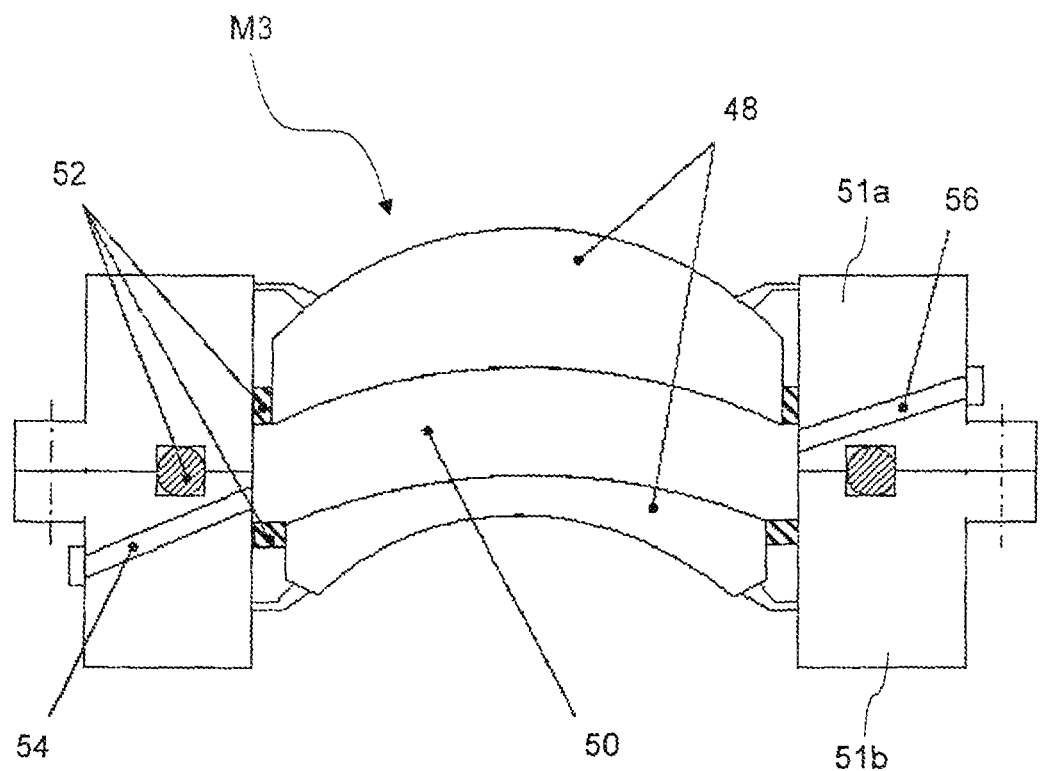
FIG. 3 shows a meridian section through a manipulator for the correction of temperature-induced image field curvatures according to a second exemplary embodiment of the invention, in which the temperature of a liquid lens can be varied.

FIG. 3 shows a manipulator M3 which is used to correct image field curvatures and, for example, may be arranged at the position in the projection objective 20 as denoted by M in FIG. 1.

Two lenses 48 form an intermediate space between them, which is filled with a liquid 50. In the exemplary embodiment which is represented, the upper of the two lenses 48 consists of calcium fluoride and the lower lens consists of amorphous quartz glass. The lenses 48 are respectively held by circumferential sealing elements 52 in their own frames 51a, 51b. A further sealing element 52 seals the two frames 51a, 51b from one another. The sealing elements 52 ensure that the liquid 50 does not emerge from the intermediate space. The sealing elements 52 are furthermore designed so that they do not cause any deformations of the lenses 48.

A first channel 50 for filling the intermediate space between the lenses 48 is provided in the frame 51b. A second channel 56 in the other frame 51a is used as an overflow and for venting.

Figure 4:
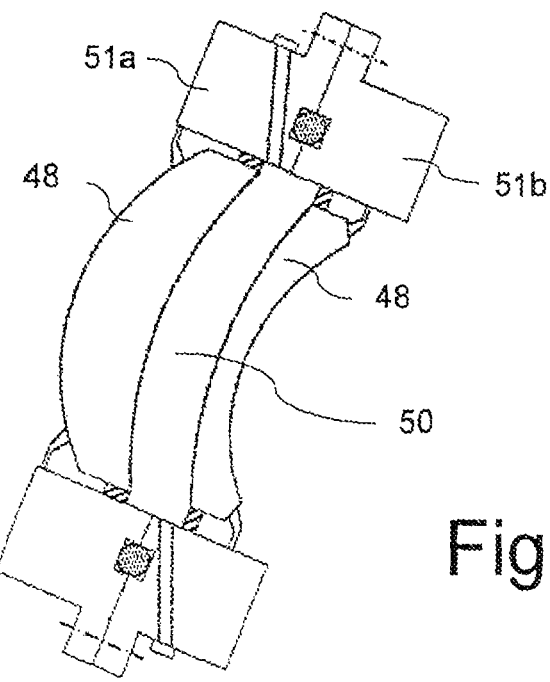
FIG. 4 shows the manipulator of FIG. 3 in a tilted position while filling with a liquid.

In order to fill the intermediate space with the liquid 50, the entire manipulator M3 is tilted as shown in FIG. 4. In this way, the intermediate space between the curved lenses 48 can be filled without forming an air bubble below a concave lens surface, which cannot escape during filling. After filling, the channels 54, 56 are closed and may also remain closed during the projection operation.

As an alternative to the design of the manipulator M3 shown in FIG. 3, the two lenses 48 may of course also be held in a common frame. A sealing element between the two individual frames is then unnecessary.

Owing to the different materials and therefore refractive indices of the two lenses 48, the liquid lens formed by the liquid 50 between the lenses 48 has a negative refracting power if the refractive index ratio at the upper interface is less than at the lower interface. When the liquid 50 is heated by the projection light 13, its refractive index decreases and therefore so does the negative refracting power of the liquid lens formed by the liquid 50. In this way, it is possible to compensate for a reduction of the positive refracting power of the liquid lens 44 formed by the immersion liquid 34. The Petzval sum thus remains at least approximately constant, so that no temperature-induced image field curvatures occur. The projection objective 20 thus corrects itself to a certain extent, without the temperature and/or the refractive index of the immersion liquid 34 having to be known in detail.

Figure 5:
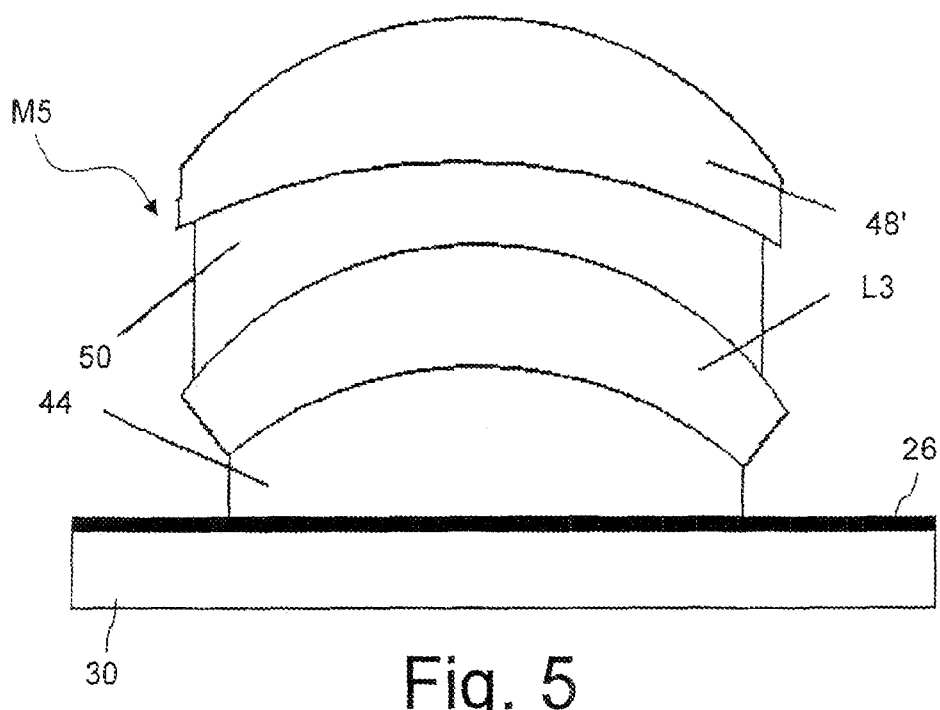
FIG. 5 shows a simplified meridian section to explain the functional principle of the manipulator shown in FIGS. 3 and 4.

FIG. 5 shows another example of a manipulator M5 operating according to this principle, in a highly schematized representation. Above the lens L3, which concavely bounds the liquid lens 44 formed by the immersion liquid 34 at the top, an intermediate space is formed toward a neighboring lens 48' and is filled with the liquid 50. The liquid 50 has a higher refractive index than the lenses 48' and L3. The liquid lens formed by the liquid 50 therefore has a negative refracting power, while the liquid lens 44 has a positive refracting power. If the refractive index decreases both in the liquid 50 and in the immersion liquid 34 in the event of a temperature rise, then the aforementioned self-correction takes place. Heating of the immersion liquid 34 does not then lead to intolerable image field curvatures.

In the exemplary embodiment shown with the aid of FIGS. 3 and 4, additional measures may be provided in order to compensate for pressure variations that may lead to a position change or deformation of the lenses 48 and therefore to imaging errors. Examples of feasible measures include a compensating container, a flexible sealing membrane and/or pressure compensation using valves. If pressure variations cannot be reliably prevented by such measures, then under certain circumstances additional manipulators will be required in order to correct imaging errors caused by pressure variations.

If the manipulator M3 is to be used for correcting image field curvatures which are produced by heating of the immersion liquid 34, then a near-field arrangement of the manipulator M3 is preferred. In this way, projection light passes through the liquid 50 in the intermediate space between the lenses 48 similarly as the immersion liquid 34. It may therefore be favorable to arrange the manipulator immediately next to the last lens L3 on the image side, as is the case for the manipulator M5 shown in FIG. 5, or in an intermediate image plane. Often, however, projection objectives do not have an intermediate image plane in or close to which the manipulator M3 can be arranged. When arranging the manipulator M3 in these cases, it should be taken into account that the projection light has a higher intensity at the object-side end of the projection objective 20. With otherwise equal conditions, therefore, the liquid 50 will be heated more strongly there than the immersion liquid 34 at the opposite end of the projection objective 20.

Gas bubbles can form in the liquid 50 both when filling the intermediate space and when degassing during operation of the projection exposure apparatus. Bubble formation during filling can be reduced if the intermediate space has the fewest possible edges and rough surfaces. The filling method explained with the aid of FIG. 4 also counteracts bubble formation. A negative pressure may furthermore be applied to the second channel 56 when filling, in order to enhance the release of gases from the liquid 50.

Since the refractive index of the liquid 50 can change because of ageing effects and contamination during the lifetime of the projection exposure apparatus 10, the liquid 50 should be replaced at regular intervals.

In the manipulators M3 and M5 explained above, the intermediate space between the lenses 48, or between the lenses L3 and 48', are closed during the projection operation so that the liquid 50 cannot circulate. As an alternative to this, the intermediate space may be open during the projection operation so that the intermediate space can be progressively flushed with the liquid 50.

In a flushed intermediate space, however, the pressure variations may be greater than in a closed intermediate space. The aforementioned measures for suppressing pressure variations are then particularly important.

Flushing the intermediate space during the projection operation also increases the risk of bubble formation. The flow of the liquid should therefore be laminar instead of turbulent. The circuit of the liquid may firstly be vented and then closed, so that no air can enter from outside. Furthermore, the surfaces of the neighboring lenses may be configured so that possible air inclusions do not adhere to the lens surfaces. For example, it is favorable for the mounts of the lenses and the seals not to be exposed to the liquid. For guiding the flow, it should furthermore be taken into account that the material erosion should be small in order to prevent contamination of the liquid.

A circulating liquid 50 has the advantage that it can be replaced more easily than in a closed volume, and furthermore continuously during the projection operation. A consistent purity of the liquid 50 can be ensured in this way.

If contamination of the immersion liquid 34, for example by the photosensitive layer 26, cannot be prevented to a sufficient extent, then it may be favorable first to contaminate the liquid 50 deliberately with dopants in order to achieve a somewhat higher absorption. The doping of the liquid 50 will then be adjusted (generally reduced) in the course of the projection operation so that the liquid 50 and the immersion liquid 34 in total have a constant transmissivity over time. This measure can moreover be expediently used independently from the correction of temperature-induced image field curvature primarily addressed here.

It is generally most favorable for the immersion liquid 34 and the liquid 50 to have the same composition. For example, the liquid 50 and the immersion liquid 34 may be taken from the same container. If they are taken from different containers, then it is expedient to ensure that the temperatures of the containers are equal. This can be achieved, for example, if the two containers are placed directly next to each other or if one container is held in the other container, so that they have a good thermal contact.

If the immersion liquid 34 and the liquid 50 are arranged at positions relatively far apart inside the projection objective 20, then it may be taken into account that the liquids have different temperatures.

Owing to the heated liquids, the temperature of the neighboring lens surfaces also rises. Deformations caused by this can be utilized, for example in the case of multi-point mounting, in order to correct spherical imaging errors. With mounting at a few points, it is also possible to correct low-order, for example second-order imaging errors. The mounts of the lenses next to the liquid 50 should therefore be deliberately designed according to the intended effect.

Figure 6:
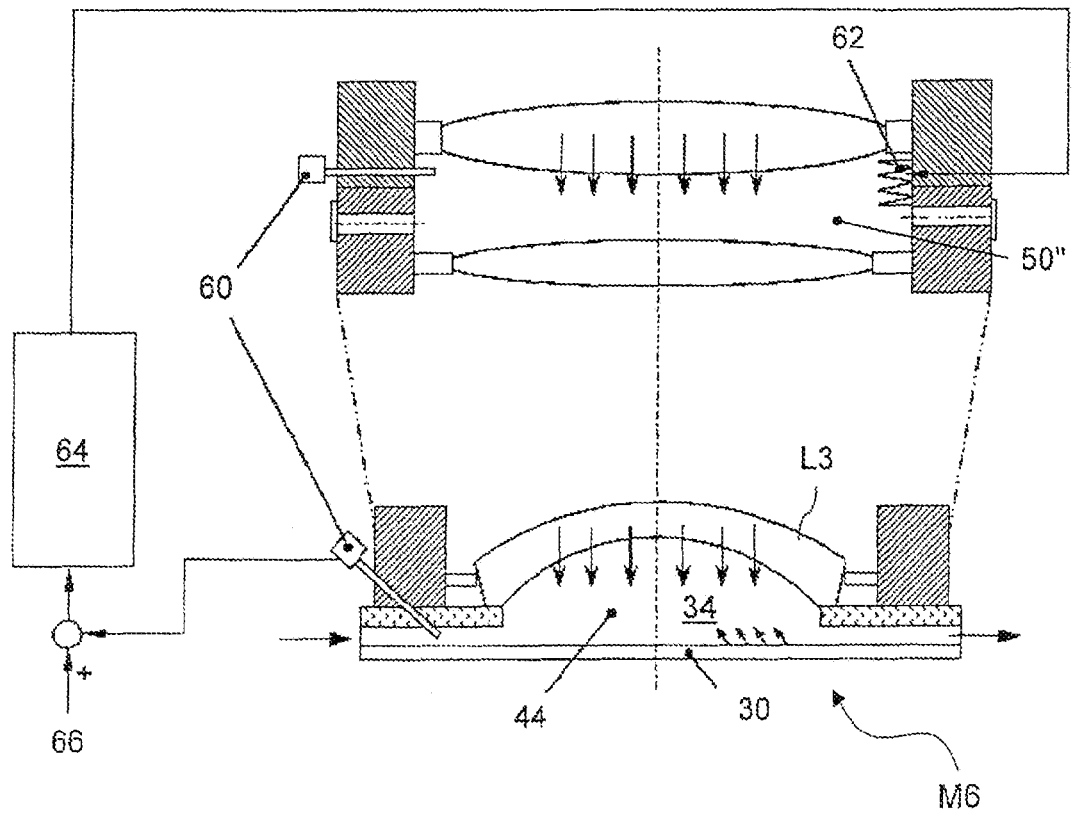
FIG. 6 shows a meridian section through a variant of the manipulator shown in FIGS. 3 and 4, with a control loop for controlling the temperature of the liquid lens.

FIG. 6 shows an exemplary embodiment of a manipulator M6 in which temperature-induced image field curvatures are corrected by active control rather than automatically. The temperatures of the liquid lens 44 formed by the immersion liquid 34 and of the liquid lens formed by the liquid 50" are recorded here by temperature sensors 60. The temperature of the liquid 50" can be changed with the aid of a heating or cooling element 62 (indicated only schematically). For example, this may comprise an external light source which directs light, to which the layer 26 is not sensitive, onto the liquid 50". A controller 64 regulates the temperature of the liquid 50" so that it is in a predetermined ratio (setpoint value 66) with the temperature of the immersion liquid 34. This ratio is preferably 1:1.

In another form of active control, image field curvatures that occur are measured. As a function of the measured image field curvatures, the temperature of the liquid lens formed by the liquid 50" is controlled so that the image field curvatures remain as small as possible independently of the operating time of the projection exposure apparatus 10.

In order to be able to influence the temperature better by design measures in the case of unregulated correction, as takes place in the exemplary embodiments shown in FIGS. 3 to 5, suitably designed passive heat sinks may for example be provided in the region of the support 30. They lower the temperature of the immersion liquid 34 so that the corrective effect of the liquid 50 is sufficient in order to keep the image field curvatures small. Instead of heat sinks, it is also possible to use instruments which can raise the temperature of the liquid 50" without an additional external energy supply. Suitable examples include absorption layers, for example of $Ta_2O_5$, which absorb unused projection light (for example scattered light or higher diffraction orders) and thereby lead to a heat input. As an alternative or in addition to this, external unregulated light sources may also raise the temperature of the liquid 50".

1.6 Density Change in Liquids or Solid Bodies

The refractive index of a liquid or a solid body also depends on the pressure in the relevant medium. It is therefore feasible to deliberately change the refractive index in the desired way by using induced density changes. Such density changes may be produced by exerting pressure on the medium. In this way, for example, it is possible to generate acoustic waves such as those known from acousto-optical modulators. FIG. 1 indicates by way of example piezo crystals 63, 65 which are arranged around the circumference of the lens L1. The piezo crystals 63, 65 are driven so that they generate a pressure wave in the lens L1 synchronously with the laser pulses generated by the light source 14, and therefore change its refractive index.

2. Shape Variation of Optical Surfaces

As mentioned above, the refracting power of optical elements can also be changed by varying the shape of a refractively or reflectively acting interface.

2.1 Two Immersion Liquids Whose Separating Surface has a Variable Shape

Figure 7:
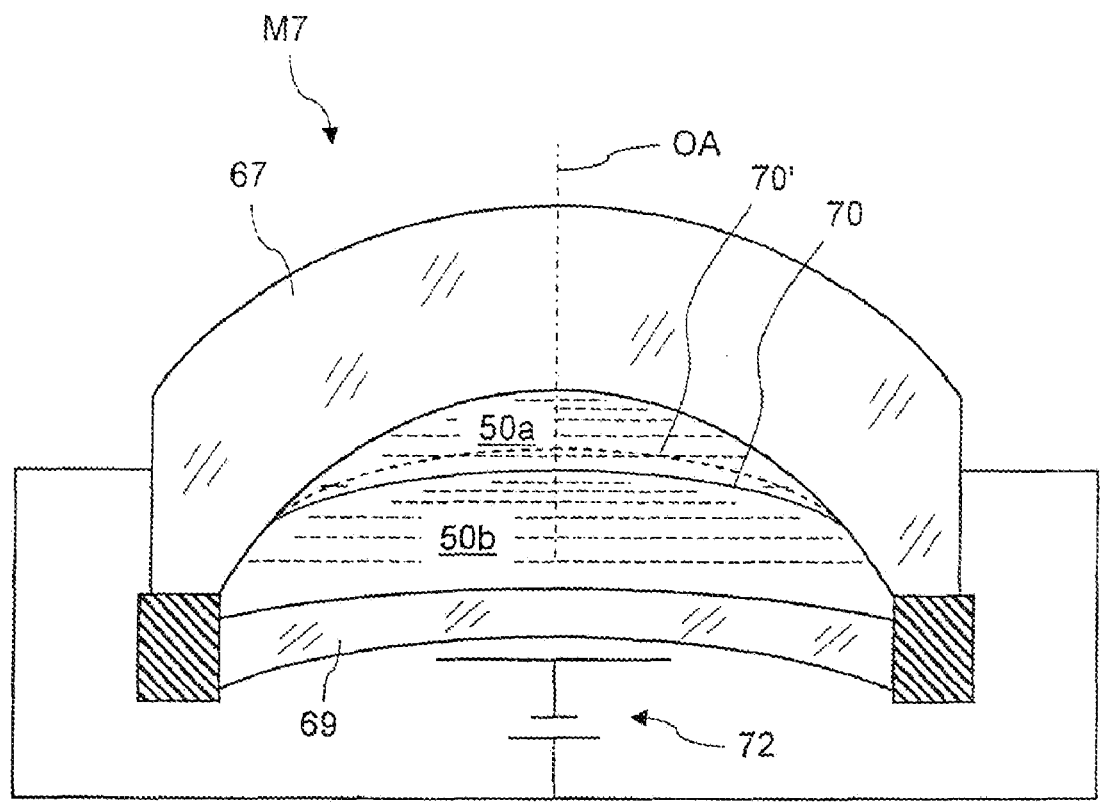
FIG. 7 shows a meridian section through a manipulator for the correction of temperature-induced image field curvatures according to a third exemplary embodiment of the invention, in which the shape of a membrane between two liquids can be varied by generating an electrical field.

FIG. 7 shows a manipulator M7 which further develops the approach described above in 1.2. The manipulator M7 comprises two lenses 67, 69, between which there is a liquid-filled intermediate space. The intermediate space is filled with two liquids 50a, 50b having different refractive indices, which are separated from each other by a thin membrane 70. The shape of the membrane 70 can be varied by applying an electrical voltage, as indicated overall by 72 in FIG. 7. By varying the voltage, the membrane 70 between the liquids 50a, 50b can be converted for example into the shape indicated by 70'. Details about the voltage-controlled bending of a membrane are described in WO 2005/081067 A1.

Since the liquids 50a, 50b have different refractive indices, deformation of the membrane 70 causes a refracting power variation by which the image field curvatures can be corrected.

The intermediate space filled with the liquids 50a, 50b may also be the intermediate space between the last lens L3 on the image side and the photosensitive layer 26, as is the case in the exemplary embodiment shown in the FIG. 2.

Another possible way of deforming a membrane between two liquids is to vary the pressure of the liquids.

Figure 8A:
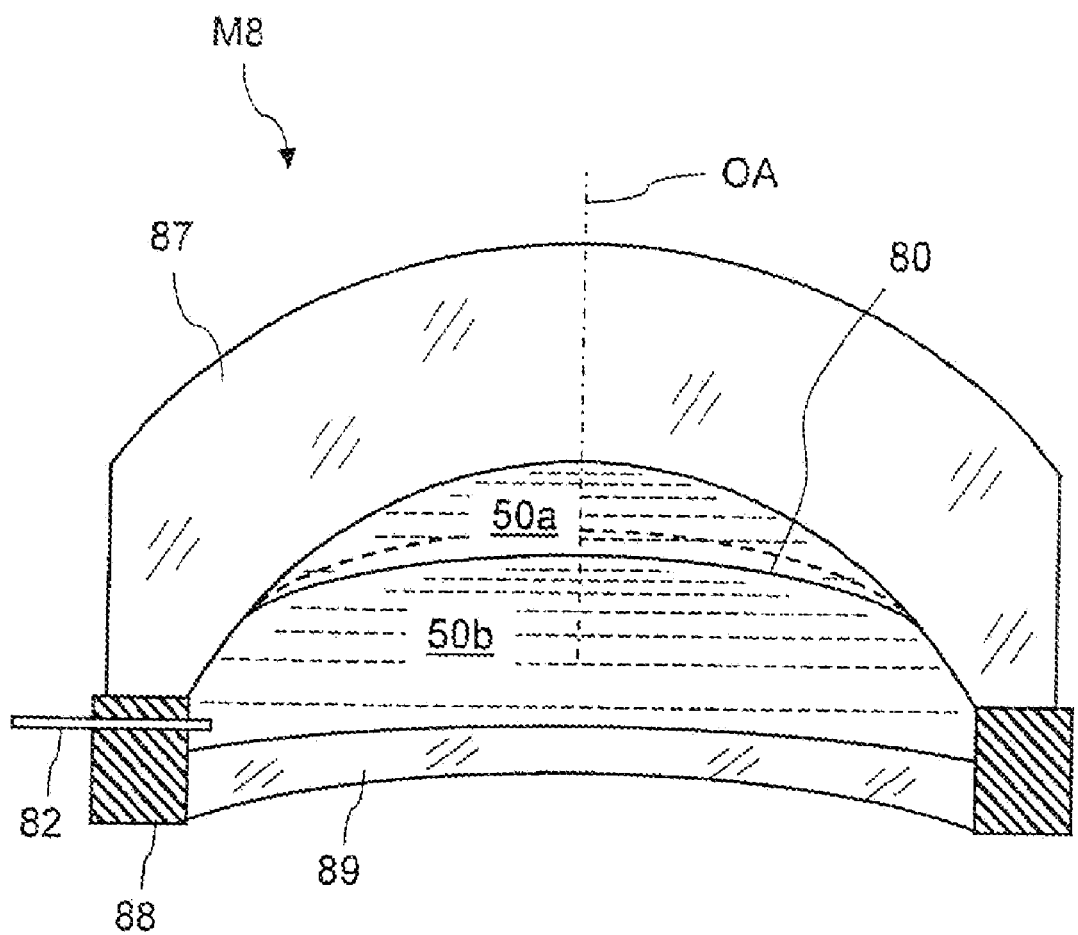
FIG. 8a shows a meridian section through a manipulator for the correction of temperature-induced image field curvatures according to a fourth exemplary embodiment of the invention, in which the shape of a membrane between two liquids can be varied by changing the pressure in one of the liquids.

FIG. 8a shows a manipulator M8 in a representation analogous to FIG. 7, which comprises two lenses 87, 89 between which there is a liquid-filled intermediate space. The intermediate space is filled with two liquids 50a, 50b having different refractive indices, which are separated from each other by a thin membrane 80. A frame 88 for the lens 89 comprises a channel 82 via which the pressure of the liquid 50b can be varied. In this way, the membrane 80 can be deformed by varying the pressure of the liquid 50b as indicated by a dashed line in FIG. 8a.

Figure 8B:
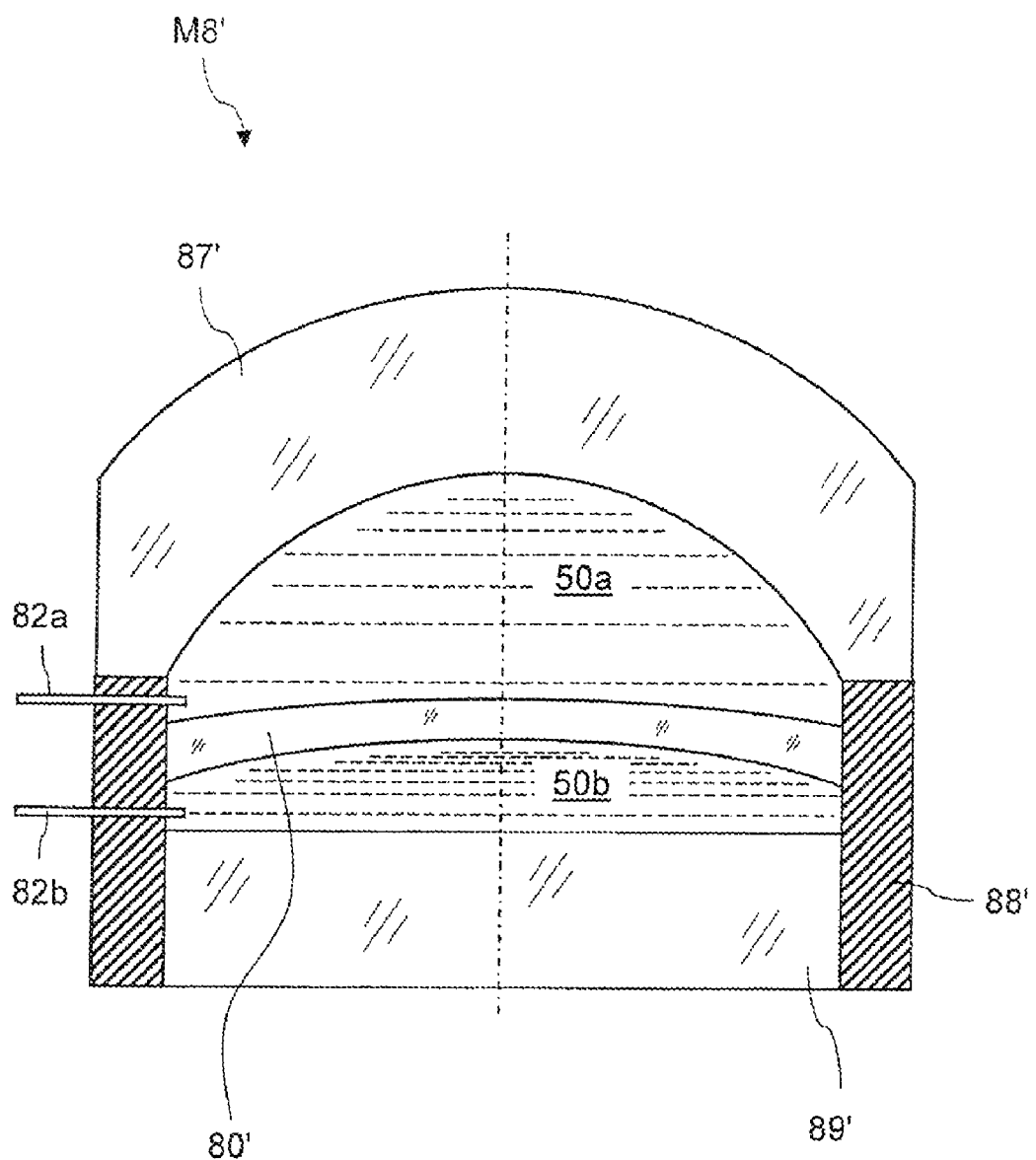
FIG. 8b shows a meridian section through a manipulator for the correction of temperature-induced image field curvatures according to a fifth exemplary embodiment of the invention, in which the shape of a thin lens between two liquids can be varied by changing the pressure in both liquids.

FIG. 8b shows a variant (denoted by M8') of the manipulator M8, in which the thin membrane 80 is replaced by a thin lens 80'. Two channels 82a, 82b, via which the pressures of the liquids 50a, 50b can be varied separately from each other, are formed in a frame 88' for the lens 80' and a plane-parallel plate 89'.

2.2 Deformation of a Lens

By deforming a lens, its refracting power can be deliberately varied.

It is simplest to provide a lens with a frame by which tensile or compressive forces—preferably acting tangentially—can be exerted on the circumference of the lens.

The pressure required in order to deform lenses may furthermore be exerted by a liquid which lies next to the lens.

Figure 9:
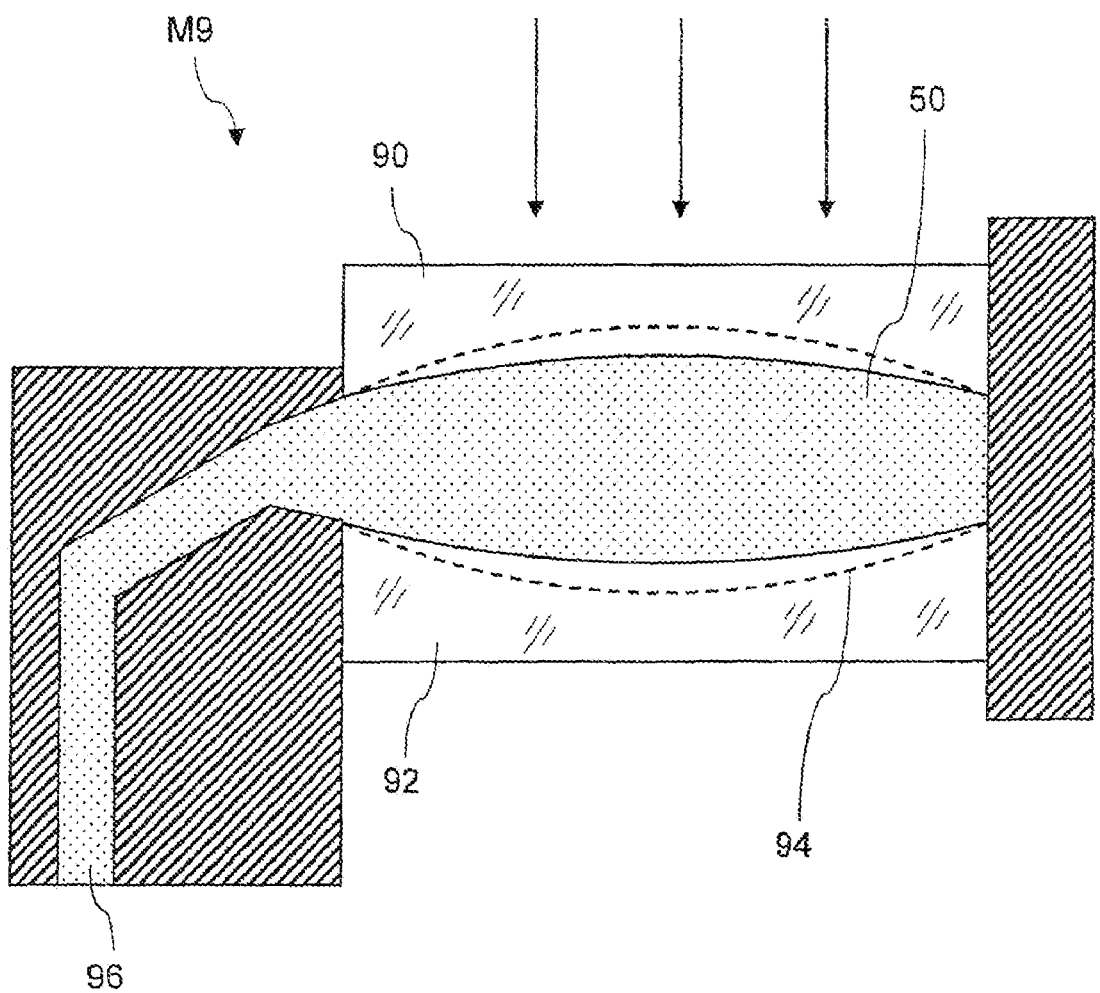
FIG. 9 shows a highly simplified meridian section through a manipulator for the correction of temperature-induced image field curvatures according to a sixth exemplary embodiment of the invention, in which the shape of two lenses enclosing a liquid can be varied by changing the liquid.

FIG. 9 shows a manipulator M9 with two lenses 90, 92 that form an intermediate space between them, which is filled with a liquid 50 and is externally sealed. The refractive index of the liquid 50 preferably differs only slightly from that of the material of which the lenses 90, 92 consist. If pressure is now exerted on the liquid 50, then the mutually opposing surfaces of the lenses 90, 92 deform as indicated by a dashed line 94 in FIG. 9.

In order to exert a pressure on the liquid 50, it may be in communication with a controllable pressure source via a channel 96.

2.3 Variable Filling of a Plurality of Intermediate Spaces Between Lenses

Figure 10:
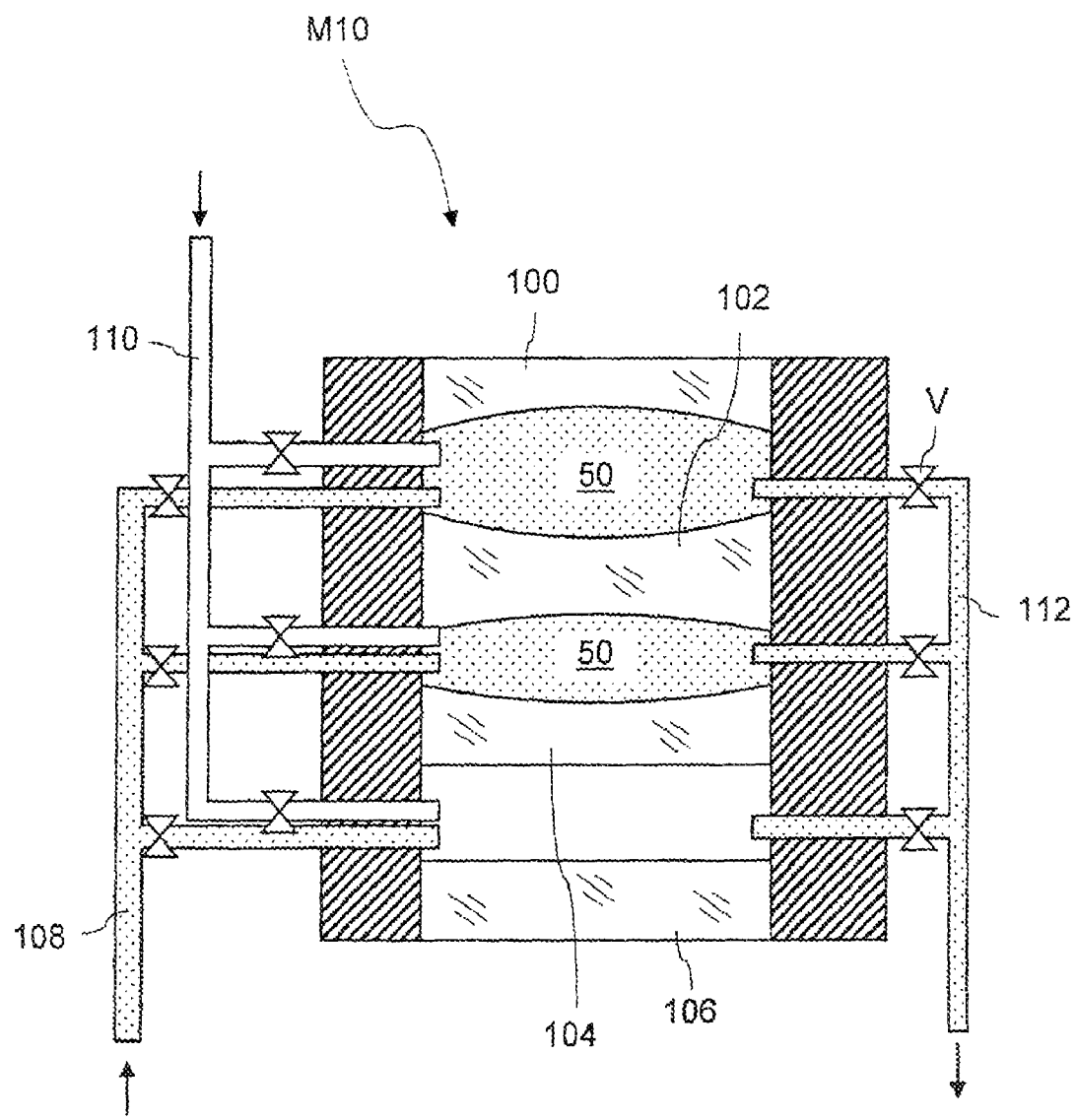
FIG. 10 shows a meridian section through a manipulator for the correction of temperature-induced image field curvatures according to a seventh exemplary embodiment of the invention, in which a plurality of intermediate spaces between lenses can be filled independently of one another with liquids.

FIG. 10 shows a manipulator M10 which comprises four lenses 100, 102, 104 and 106 with differently curved surfaces. Pairs of neighboring lenses form intermediate spaces between them, which can be filled independently of one another via a line system, controllable by valves V, with a liquid whose refractive index preferably differs not too greatly from the refractive index of the lens material. In the state shown in FIG. 10, the intermediate spaces between the lenses 100 and 102 and between the lenses 102 and 104 are filled with a liquid 50, while the intermediate space between the lenses 104 and 106 is only filled with a gas. The line system comprises a liquid feed 108, a gas feed 110 and a common liquid and gas outlet 112.

Depending on which of the intermediate spaces have been filled with the liquid 50, the neighboring lenses deliver a different contribution to the Petzval sum. At least discrete albeit not continuous reduction of the image field curvature is therefore possible.

The manipulator may of course comprise only two or more than three intermediate spaces, which furthermore need not neighbor one another but may be arranged distributed over the projection objective 20.

2.4 Synchronously Moved Aspheres

Aspheres have the property that their curvature varies continuously over the optically active surface. If aspherical surfaces are suitably combined so that they can be swiveled with swiveling movements about a swivel axis lying far outside the surfaces, such that they represent a different vertex radius, then with such an arrangement it is possible to influence the Petzval sum and therefore correct an image field curvature. A similar principle is used for example in Alvarez lenses which are used to determine the refraction of the eye. There, however, the lenses are not swiveled but moved in translation in a plane perpendicular to the optical axis. Further details about this known approach can be found in the aforementioned EP 0 851 304 B1.

An exemplary embodiment of a manipulator whose action is based on the principle of swiveled aspherical surfaces will be explained below with reference to FIGS. 11a and 11b.

FIGS. 11a and 11b show a highly simplified azimuthal section of a manipulator M11 in two different configurations. The manipulator M11 comprises two aspherical thin convex-concave meniscus lenses L110, L111. The two meniscus lenses L110, L111 respectively have an aspherical surface 110a and 111a, as well as a spherical surface 110b and 111b. The shape of the aspherical surfaces 110a, 111a will be explained in more detail below with reference to FIGS. 12 and 13.

The spherical surfaces 110b, 111b of the two meniscus lenses L110, L111 are guided with the aid of ball or rolling bearings (not shown) so that the meniscus lenses L110, L111 can be swiveled about swivel axes in the Y direction. Other bearings of the meniscus lenses L110, L111 will be explained below with reference to FIGS. 14 to 20. The swivel axes respectively contain the respective center of curvature of the spherical surfaces 110b and 111b. Swiveling movements of the meniscus lenses L110, L111 are indicated by arrows 114 and 116 in FIG. 11a.

It can be seen in FIG. 11a that the aspherical surface 110a of the meniscus lens L110 has an increasing curvature with increasing X coordinates. As will be explained below with the aid of FIGS. 12 and 13, the curvature in this case increases not only along the X direction but also perpendicularly thereto, i.e. along the Y direction. The converse applies for the second meniscus lens L111, so that the curvature increases in the X and Y directions with decreasing X coordinates.

In this way, the overall action of the two meniscus lenses L110, L111 is at least approximately rotationally symmetric. This approximation is commensurately better when the meniscus lenses L110, L111 are thinner and their mutual spacing in the Z direction is smaller.

If the two meniscus lenses L110, L111 are now swiveled in the direction indicated by the arrow 114 or 116 about the center of curvature, then this merely affects the aspherical surfaces 110a, 111a. The spherical surfaces 110b, 111b do not change their effect, since their center of curvature lies on the swivel axes.

By the swiveling however, the aspherical surface 110a of the meniscus lens L110 is displaced relative to a diaphragm 112 delimiting the light path so that the regions with greater curvature enter the light path. The original position of the meniscus lens L110 is represented by dots in FIG. 11b for illustration. The same applies for the second meniscus lens L111. By swiveling the two meniscus lenses L110, L111 in the manner shown in FIG. 11b, the manipulator M11 is thus provided with a higher refracting power. The refracting power change can be arbitrarily adjusted by gradual swiveling of the two meniscus lenses L110, L111.

The manipulator M11 is particularly suitable for being arranged in a curved pupil of the projection objective 20. This is related to the fact that the aspherical lenses L110, L111 in the manipulator M11 are not displaced perpendicularly to the optical axis but are swiveled about an axis perpendicular to the optical axis.

If the surfaces 110a, 110b and 111a, 111b of the lenses L110 and L111 are optimally adapted to the curvature of the pupil of the projection objective 20, then this adaptation will also be preserved after a swiveling process. Such a design of the optical elements, adapted to the curvature of the pupil, is not possible in the case of aspherical surfaces which are moved in translation in a plane perpendicular to the optical axis.

The particular shape of the aspherical surfaces 110a, 111a will now be explained in more detail with reference to FIGS. 12 and 13.

Figure 12:
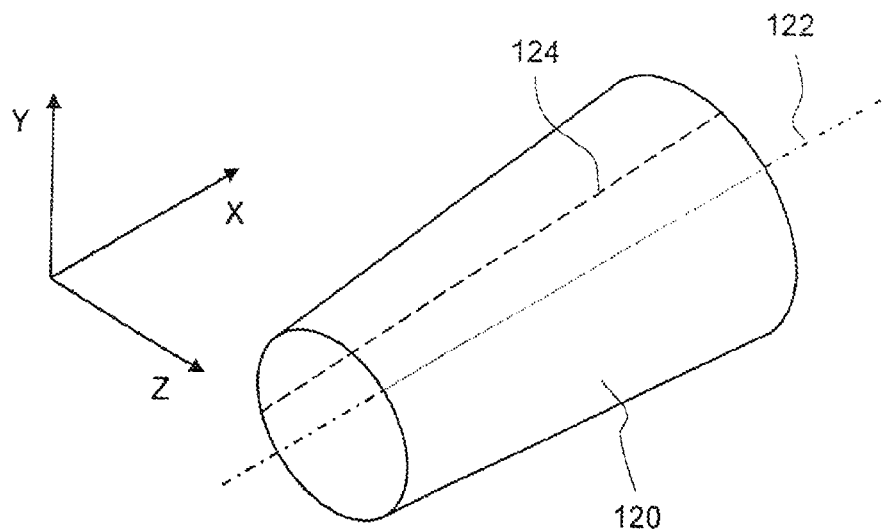
FIG. 12 shows a conical generated surface.

FIG. 12 shows a section of a conical generated surface 120, the symmetry axis 122 of which is aligned parallel to the X direction.

When moving on the generated surface 120 along a line 124, which is given by intersection of the generated surface 120 with a mid-plane parallel to the XZ plane, the curvature on this line in the X direction is equal to zero. In YZ planes perpendicular thereto, however, the curvature increases continuously with decreasing X coordinates. The generated surface 120 therefore has the property that its curvature is constant (i.e. infinite) in one direction and continuously decreases perpendicularly thereto.

Figure 13:
FIG. 13 shows a generated surface which is produced by curvature from the generated surface shown in FIG. 12.
Figure 13:
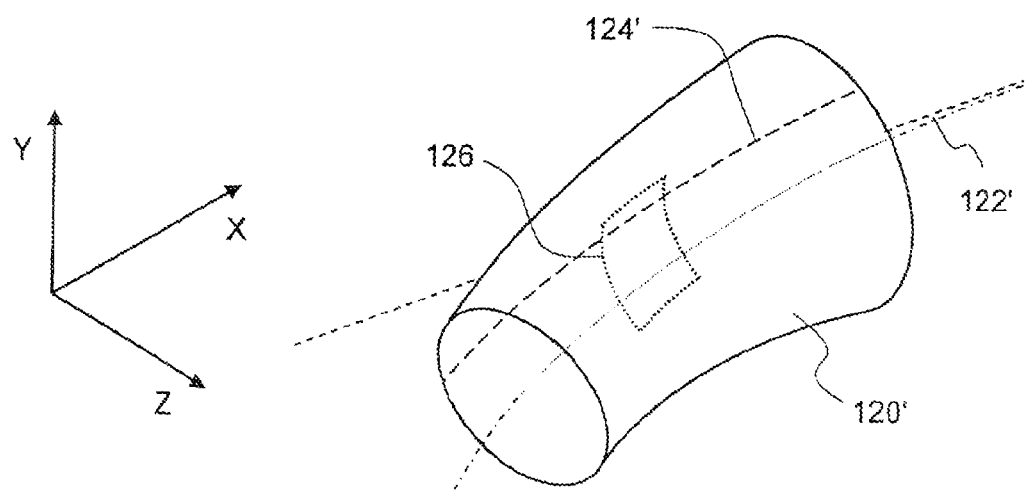

If the symmetry axis 122 of the conical generated surface 120 is bent so that its curvature becomes ever greater, then the generated surface 120 is converted into the generated surface 120' shown in FIG. 13. When moving on a line 124' corresponding to the line 124, the curvature now continuously increases both in XZ planes and in YZ planes with decreasing X coordinates.

The aspherical surfaces 110a, 111a have precisely this property and can therefore be described as a segment 126 of the generated surface 120'. The situation is to this extent comparable with the geometry of a snail shell, in which the curvature likewise decreases in two mutually perpendicular directions when moving on a turn of the snail shell toward the tip of the snail shell.

Merely for accuracy, it should be mentioned that the curvatures of the aspherical surfaces 110a, 111a are represented very exaggeratedly for the purpose of better clarity. Very minor variations of the curvature when swiveling are sufficient in order to be able to correct an image field curvature with the aid of the manipulator M11. The rotation angles are also represented exaggeratedly in FIG. 11b. Under certain circumstances, it may be sufficient for the meniscus lenses L110 and L111 to swivel through fractions of a degree in order to achieve a corrective effect. Because of this small swiveling angle, it may be sufficient to swivel merely one of the two meniscus lenses L110 and L111 or even to approximate the swiveling movement by tilting. Even if the manipulator contains only one aspherical lens instead of two, an image field curvature can be effectively corrected by movement of this lens when an astigmatism introduced by the lens is tolerable or can be corrected by additional measures.

Some variants of the way in which the aforementioned movements of one or two aspherical lenses can be produced will be explained briefly below. For the sake of better clarity, aspherical surfaces are sometimes indicated as undulating surfaces in this case.

Figure 14:
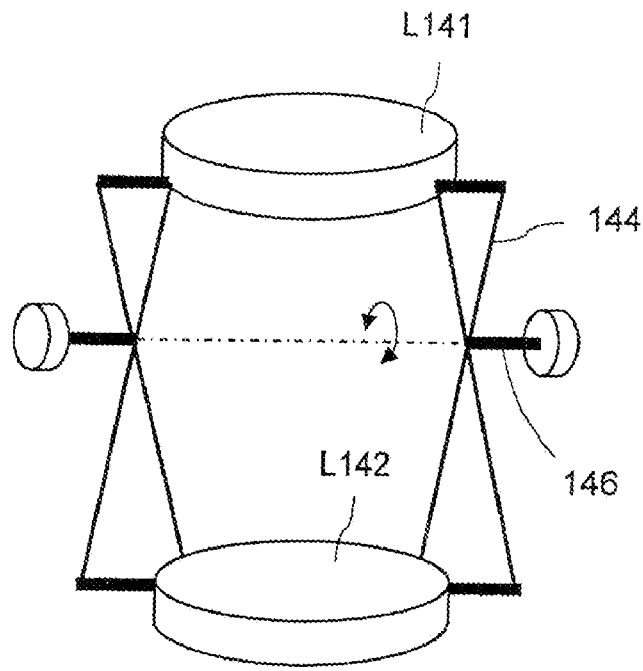
FIG. 14 shows a perspective outline representation of an articulation mechanism for the synchronous swiveling of two lenses.

In the variant shown in FIG. 14, two aspherical lenses L141, L142 are firmly connected to each other via a framework 144. The rotation axis 146 of the two lenses L141, L142 can be variably adjusted by modifying the framework 144. This provides an additional degree of freedom which can be utilized for the correction.

Figure 15:
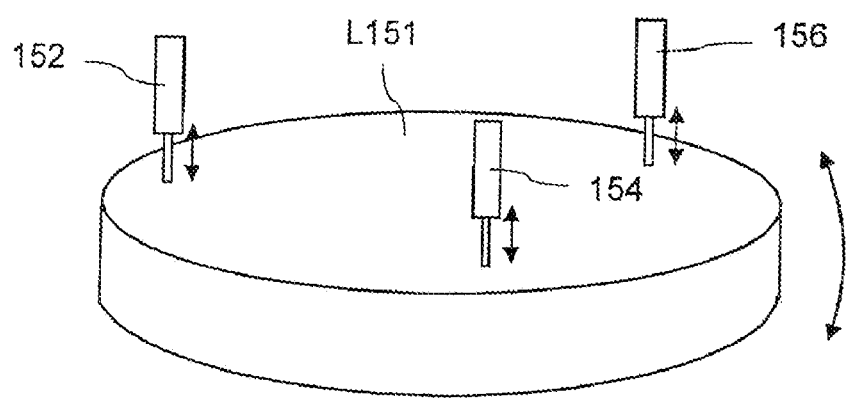
FIG. 15 shows a perspective outline representation of an articulation mechanism for the tilting of a lens.

FIG. 15 shows a variant in which an inner ring holding the lens can be moved relative to an outer ring (not shown) via three linear actuators 152, 154, 156, aligned parallel to the optical axis, in order to tilt an aspherical lens L151. The actuators 152, 154, 156 allow not only displacement of the lens L151 along the optical axis, which per se is unnecessary for correction of the image field curvature, but also tilting relative to the optical axis. By its very principle the rotation point lies relatively close to the lens L151, however, which often is not optimal for optimal correction of the image field curvature. A second aspherical lens may of course also be moved in this way.

Figure 16:
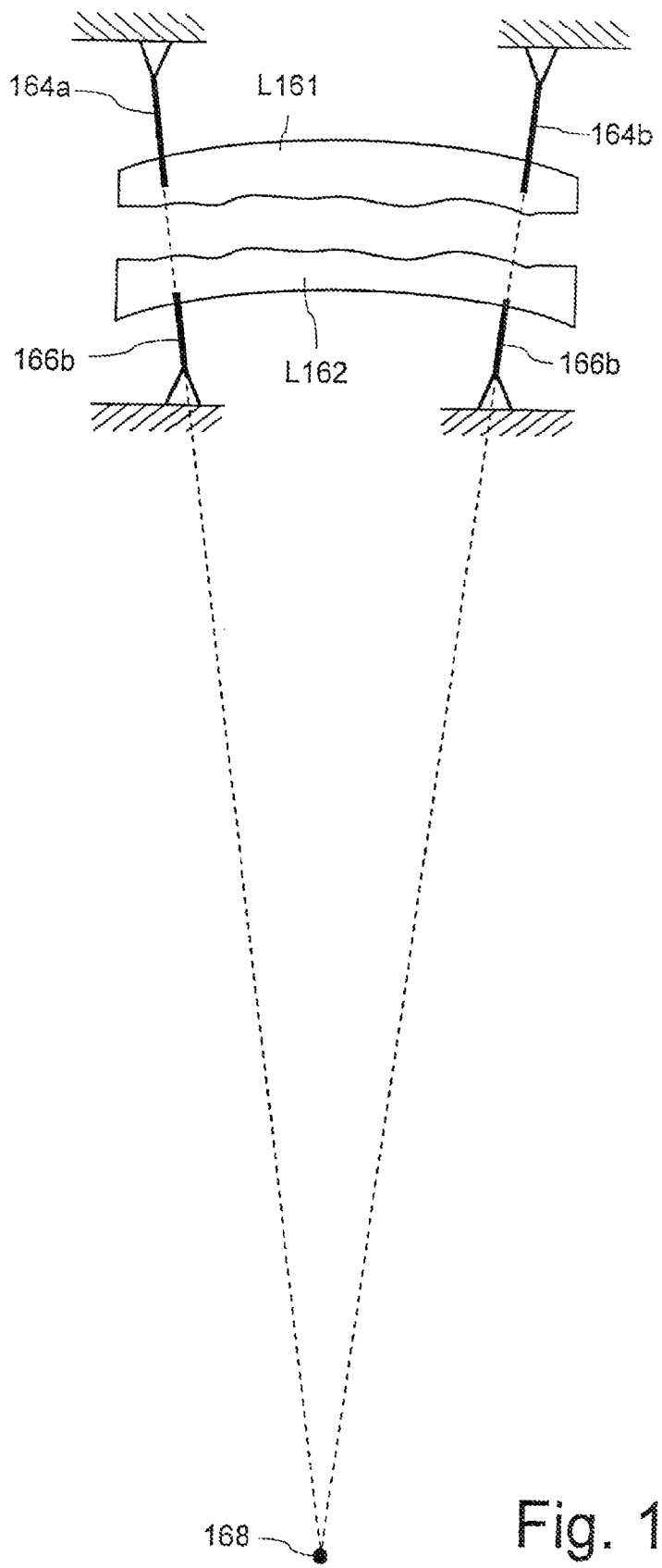
FIG. 16 shows a sectional representation of an articulation mechanism for the swiveling of two lenses about a common swivel axis.

FIG. 16 shows a variant in which a swiveling movement is possible about an axis relatively far away from aspherical lenses L161, L162. Actuators 164a, 164b and 166a, 166b for the lenses L161 and L162 are designed here so that their longitudinal axes intersect in a common swivel axis 168.

Figure 17:
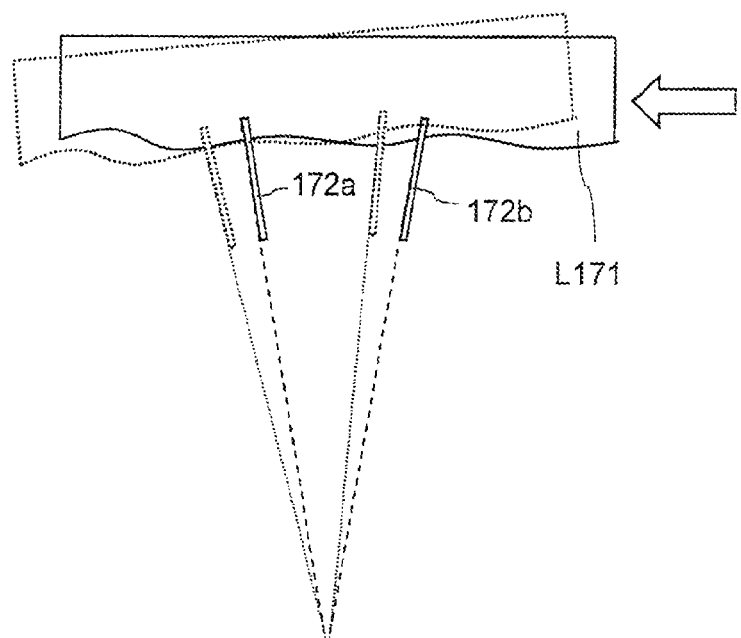
FIG. 17 shows a sectional representation of an articulation mechanism for the swiveling of a lens with leaf springs.
Figure 18:
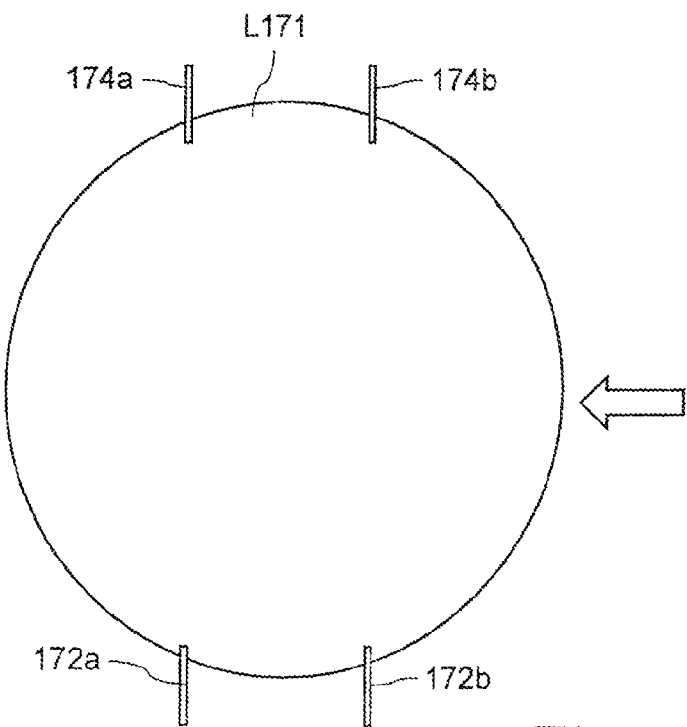
FIG. 18 shows a plan view of the articulation mechanism shown in FIG. 17.

A similar effect can also be achieved by using leaf springs 172a, 172b, as shown schematically for an aspherical lens L171 in the side view of FIG. 17 and the plan view of FIG. 18.

In general, 2 actuators are required in order to be able to swivel or tilt two aspherical lenses. Yet since the movement must be functionally coupled, it is also possible to actuate only a single actuator. This will then act simultaneously on both aspherical lenses via a suitable transmission.

Figure 19:
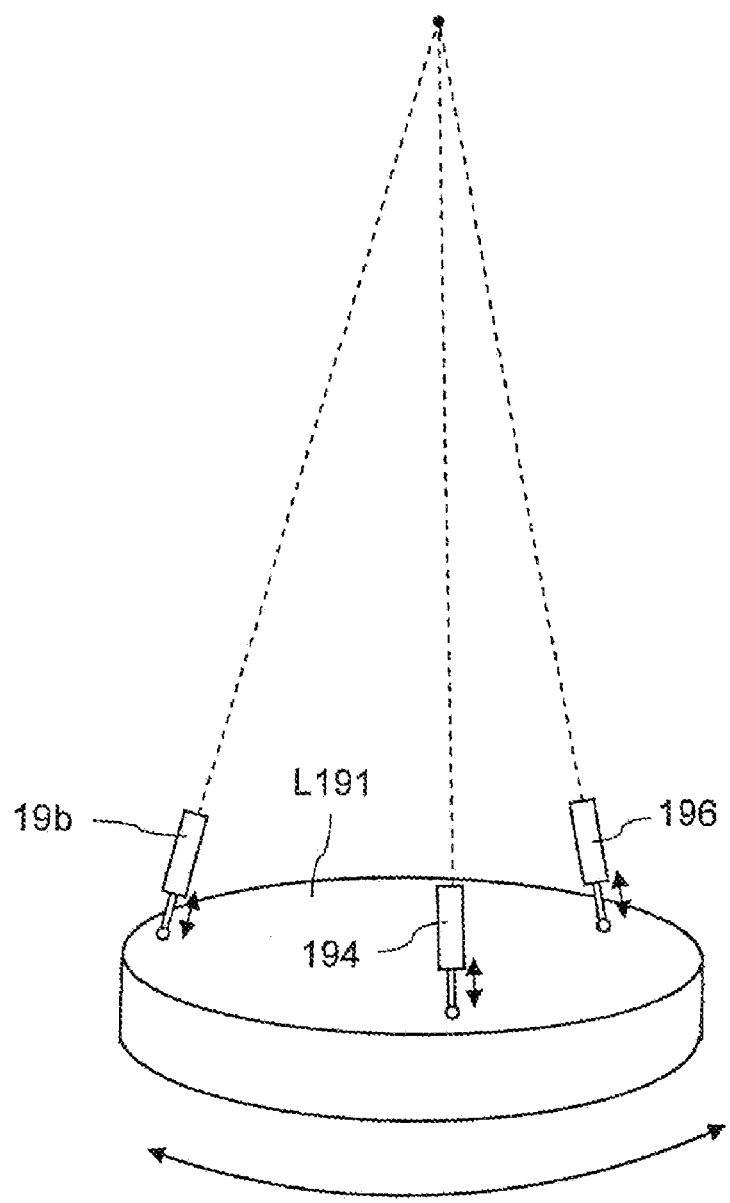
FIG. 19 shows a perspective outline representation of an articulation mechanism for the swiveling of a lens.

In the variant shown in FIG. 19, three linear actuators 192, 194, 196 are connected via ball joints to a suspension (not shown) on the one hand, and an aspherical lens L191 on the other hand, so that a swiveling movement of the lens L191 can be carried out about a freely selectable rotation point. Instead of the linear actuators 192, 194, 196, it is of course also possible to use other actuators, for example electrically bendable flexion rods.

Figure 20:
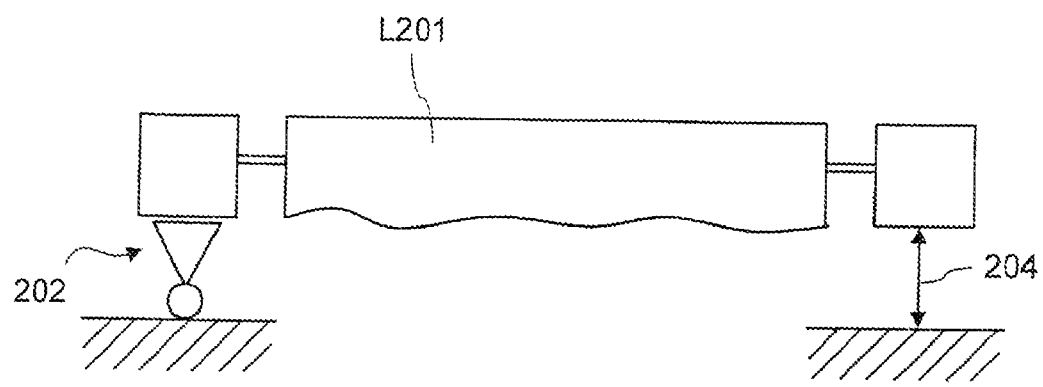
FIG. 20 shows a simplified sectional representation of a simple tilting mechanism.

FIG. 20 shows a particularly simple way of tilting an aspherical lens L201 about a tilting axis perpendicular to the optical axis. To this end, an inner ring is mounted relative to an outer ring via a fixed articulation 202. The adjusting movement is generated by a linear actuator 204. The rotation axis can be modified by adjusting the articulation 202.

Figure 21:
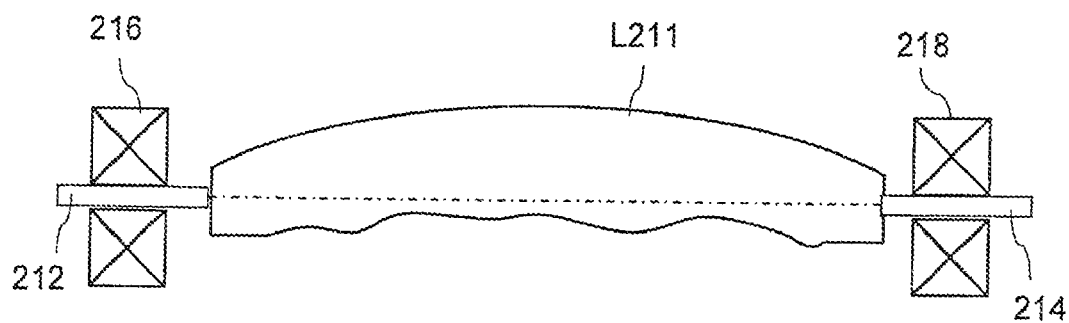
FIG. 21 shows a simplified sectional representation of a simple rotation mechanism for the rotation of a lens about a rotation axis, which extends perpendicularly to the symmetry axis of the lens.

In the variant shown in FIG. 21, an aspherical lens L211 can be rotated about a rotation axis extending through the circumference of the lens. To this end, an inner ring holding the lens L211 is connected to mutually opposite rotation pins 212, 214, which are held in ball bearings 216 and 218.

2.5 Active Mirrors

In catadioptric projection objectives, a curved mirror can be used to correct an image field curvature caused by the design of the projection objective. If such a curved mirror is designed as an active mirror so that its (vertex) curvature can also be varied, then temperature-induced image field curvatures can also be effectively corrected by such a mirror.

In order to change the image field curvature per se, it would be advantageous to vary the curvature of near-field mirrors. In conventional projection objectives, however, there are generally no such near-field mirrors. In unobscured systems, near-field mirrors are used off-axially and produced only as segments, so that for deformation it is generally insufficient simply to change the radius in this case. Instead, the mirror must also have its position varied in addition to changing the generally aspherical surface.

2.6 Other Measures

A manipulator for correcting an image field curvature may also be formed by a set of diffractive optical elements, for instance in the manner of Fresnel lenses, whose refracting powers differ from one another. To this end, the manipulator comprises an exchange holder with which an intended diffractive optical element can be introduced into the beam path. The exchange holder may, for example, be a revolver holder with which one of a plurality of diffractive optical elements, which are held by the revolver holder, can respectively be rotated into the beam path.

Instead of diffractive optical elements, it is of course also possible to use a set of Petzval lenses with different refracting powers.

Furthermore, an image field curvature may be counteracted by bending the reticle.

3. Avoidance of Induced Image Errors

With the manipulators explained above, it is possible to effectively correct even sizeable image field curvatures, such as those which conventionally occur when liquid lenses are heated. However, the manipulators themselves may introduce new imaging errors which under certain circumstances necessitate additional corrective measures.

Figure 22:
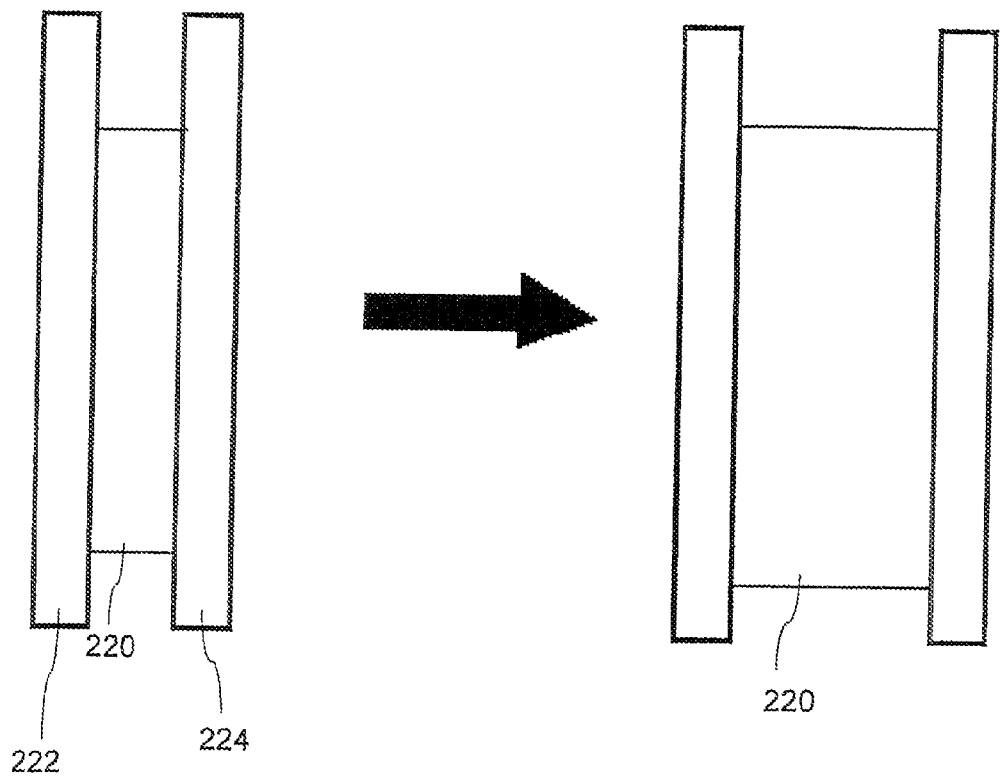
FIG. 22 shows a simplified meridian section through a corrective device for the correction of spherical aberrations, in which the correction induces an image field curvature.

A liquid plane plate, whose thickness is variable, may be used in order to correct spherical aberrations. With the aid of a simple outline representation, FIG. 22 shows the way in which a plane-parallel intermediate space between two plane-parallel plates 222, 224, which is filled with a liquid 220, can have its dimension along the optical axis varied by adding or removing liquid 220 via a feed (not shown). In order to permit variation of the amount of liquid in the intermediate space, at least one of the two plane-parallel plates 222, 224 should be held in the projection objective 20 so that it can be displaced along the optical axis.

It is naturally most favorable for the temperature-induced image field curvatures to be kept a priori as small as possible.

To this end, for example, one or more of the following measures may be implemented:

Mixing the liquid using a rotating shell;
Establishing the shape of the liquid-filled intermediate space so that the liquid is mixed better;
In the case of the last lens on the image side, the immersion liquid flows through the intermediate space between it and the wafer so that a defined laminar flow is set up;
Configuring the optically unused parts of the lens surfaces next to the liquid so that only laminar flows of the liquid are possible. Channels or a kind of drainage may be used for this purpose, although dead regions should be avoided.

What is claimed is:

1. A microlithographic projection exposure apparatus, comprising:
   a) a projection objective, which
      during use of the projection exposure apparatus is capable of imaging an object onto an image plane and has a lens with a curved surface,
   b) a liquid or solid medium which
      directly adjoins the curved surface over a region which during use of the projection exposure apparatus is capable of being used to image the object, and
   c) an adjustable manipulator which during use of the projection exposure apparatus, is capable of reducing an image field curvature which is caused by heating of the medium during the projection operation,
   wherein the manipulator comprises at least one aspherical lens which is shaped so that it represents a different vertex radius in the event of a swiveling movement about a swivel axis perpendicular to an optical axis.

2. The microlithographic projection exposure apparatus of claim 1, wherein the at least one aspherical lens has a spherical surface with a center of curvature which lies on the swivel axis.

3. The microlithographic projection exposure apparatus of claim 1, wherein the lens is the last lens on the image side of the projection objective, and the medium is an immersion medium which is arranged between the last lens on the image side and the image plane.

4. The microlithographic projection exposure apparatus of claim 1, wherein, during use, the manipulator changes the refractive power of an optical element other than the medium.

5. The projection microlithographic exposure apparatus of claim 4, wherein the optical element is arranged in or in immediate proximity to an intermediate image of the projection objective.

6. A microlithographic projection exposure apparatus, comprising:
   a) a projection objective, which
      during use of the projection exposure apparatus is capable of imaging an object onto an image plane and has a lens with a curved surface,
   b) a liquid or solid medium which
      directly adjoins the curved surface over a region which during use of the projection exposure apparatus is capable of being used to image the object, and
   c) an adjustable manipulator which during use of the projection exposure apparatus, is capable of reducing an image field curvature which is caused by heating of the medium during the projection operation,
   wherein the manipulator comprises at least one aspherical lens which is shaped so that it represents a different vertex radius in the event of a swiveling movement about a swivel axis perpendicular to an optical axis, and
   wherein the swivel axis lies outside the at least one aspherical lens.

7. The microlithographic projection exposure apparatus of claim 6, wherein the at least one aspherical lens has an aspherical surface which is shaped so that its curvature on a section line formed with a plane surface changes continuously along the section line and perpendicularly thereto.

8. The microlithographic projection exposure apparatus of claim 6, wherein the lens is the last lens on the image side of the projection objective, and the medium is an immersion medium which is arranged between the last lens on the image side and the image plane.

9. The microlithographic projection exposure apparatus of claim 6, wherein, during use, the manipulator changes the refractive power of an optical element other than the medium.

10. The projection microlithographic exposure apparatus of claim 9, wherein the optical element is arranged in or in immediate proximity to an intermediate image of the projection objective.

11. A microlithographic projection exposure apparatus, comprising:
   a) a projection objective, which
      during use of the projection exposure apparatus is capable of imaging an object onto an image plane and has a lens with a curved surface,
   b) a liquid or solid medium which
      directly adjoins the curved surface over a region which during use of the projection exposure apparatus is capable of being used to image the object, and
   c) an adjustable manipulator which during use of the projection exposure apparatus, is capable of reducing an image field curvature which is caused by heating of the medium during the projection operation,
      wherein the manipulator comprises at least one aspherical lens which is shaped so that it represents a different vertex radius in the event of a swiveling movement about a swivel axis perpendicular to an optical axis,
      wherein the swivel axis lies outside the at least one aspherical lens, and
      wherein the at least one aspherical lens has a spherical surface with a center of curvature which lies on the swivel axis.

12. The microlithographic projection exposure apparatus of claim 11, wherein the lens is the last lens on the image side of the projection objective, and the medium is an immersion medium which is arranged between the last lens on the image side and the image plane.

13. The microlithographic projection exposure apparatus of claim 11, wherein, during use, the manipulator changes the refractive power of an optical element other than the medium.

14. The projection microlithographic exposure apparatus of claim 13, wherein the optical element is arranged in or in immediate proximity to an intermediate image of the projection objective.

15. A microlithographic projection exposure apparatus, comprising:
   a) a projection objective, which
      during use of the projection exposure apparatus is capable of imaging an object onto an image plane and has a lens with a curved surface,
   b) a liquid or solid medium which
      directly adjoins the curved surface over a region which during use of the projection exposure apparatus is capable of being used to image the object, and
   c) an adjustable manipulator which during use of the projection exposure apparatus, is capable of reducing an image field curvature which is caused by heating of the medium during the projection operation,
      wherein the manipulator comprises at least one aspherical lens which is shaped so that it represents a different vertex radius in the event of a swiveling movement about a swivel axis perpendicular to an optical axis, and
      wherein the at least one aspherical lens has an aspherical surface which is shaped so that its curvature on a section line formed with a plane surface changes continuously along the section line and perpendicularly thereto.

16. The microlithographic projection exposure apparatus of claim 15, wherein the at least one aspherical lens has a spherical surface with a center of curvature which lies on the swivel axis.

17. The microlithographic projection exposure apparatus of claim 15, wherein the swivel axis lies outside the at least one aspherical lens, and the at least one aspherical lens has a spherical surface with a center of curvature which lies on the swivel axis.

18. The microlithographic projection exposure apparatus of claim 15, wherein the lens is the last lens on the image side of the projection objective, and the medium is an immersion medium which is arranged between the last lens on the image side and the image plane.

19. The microlithographic projection exposure apparatus of claim 15, wherein, during use, the manipulator changes the refractive power of an optical element other than the medium.

20. The projection microlithographic exposure apparatus of claim 19, wherein the optical element is arranged in or in immediate proximity to an intermediate image of the projection objective.

* * * * *

UNITED STATES PATENT AND TRADEMARK OFFICE
CERTIFICATE OF CORRECTION

PATENT NO. : 8,319,944 B2  
APPLICATION NO. : 12/825001  
DATED : November 27, 2012  
INVENTOR(S) : Helmut Beierl Page 1 of 1

It is certified that error appears in the above-identified patent and that said Letters Patent is hereby corrected as shown below:

Title page, item [75] Col. 1 (Inventors),  
Line 10, Delete "Ari" and insert --Arif--

Title page, item [74] Col. 2 (Attorney, Agent or Firm),  
Line 1, Delete "Richardon" and insert --Richardson--

Page 2, Col. 2 (Other Publications),  
Line 1, Delete "Conely," and insert --Conley,--

Column 18,  
Line 38, Delete "projection microlithographic" and insert --microlithographic projection--

Column 19,  
Line 9, Delete "projection microlithographic" and insert --microlithographic projection--

Column 19,  
Line 44, Delete "projection microlithographic" and insert --microlithographic projection--

Column 20,  
Line 42, Delete "projection microlithographic" and insert --microlithographic projection--

Signed and Sealed this  
Fifth Day of March, 2013

Teresa Stanek Rea  
*Acting Director of the United States Patent and Trademark Office*